US012804951B2

(12) United States Patent
Chou et al.

(10) Patent No.: US 12,804,951 B2
(45) Date of Patent: Nov. 17, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Chun Yi Chou, Hsinchu City (TW); Guan-Lin Chen, Hsinchu County (TW); Shi Ning Ju, Hsinchu City (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 446 days.

(21) Appl. No.: 18/480,068

(22) Filed: Oct. 3, 2023

(65) Prior Publication Data

US 2025/0113539 A1 Apr. 3, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 62/13*** | (2025.01) |
| ***H10D 64/01*** | (2025.01) |
| ***H10D 84/01*** | (2026.01) |

(Continued)

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 62/151* (2025.01); *H10D 64/017* (2025.01); *H10D 64/018* (2025.01); *H10D 64/021* (2025.01); *H10D 84/013* (2025.01); *H10D 84/0135* (2025.01); *H10D 84/0147* (2025.01); *H10D 84/038* (2025.01); *H10D 84/83* (2025.01)

(58) Field of Classification Search
CPC ............... H10D 64/021; H10D 84/013; H10D 84/0135; H10D 84/0147; H10D 84/038; H10D 84/83; H10D 30/6735; H10D 30/014; H10D 30/43; H10D 30/6757; H10D 62/121; H10D 62/151; H10D 64/017; H10D 64/018; B82Y 10/10
See application file for complete search history.

(56) References Cited

U.S. PATENT DOCUMENTS 9,209,247 B2 12/2015 Colinge et al.
9,236,267 B2 1/2016 De et al.
(Continued)

OTHER PUBLICATIONS

U.S. Filing Receipt for U.S. Appl. No. 18/234,502, dated Aug. 28, 2023.

*Primary Examiner* — Galina G Yushina
(74) *Attorney, Agent, or Firm* — Birch, Stewart, Kolasch & Birch, LLP

(57) ABSTRACT

A method includes forming semiconductive sheets over a substrate and arranged in a vertical direction; forming source/drain regions on either side of each of the semiconductive sheets; forming first air gap inner spacers interleaving with the semiconductive sheets; forming a gate around each of the semiconductive sheets, wherein the first air gap inner spacers are laterally between the gate and a first one of the source/drain regions.

20 Claims, 31 Drawing Sheets

C-C'

(51) Int. Cl.

| | |
|---|---|
| ***H10D 84/03*** | (2025.01) |
| ***H10D 84/83*** | (2025.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2018/0331232 | A1* | 11/2018 | Frougier | H10D 30/014 |
| 2018/0358435 | A1* | 12/2018 | Mochizuki | H10D 30/6757 |
| 2019/0157414 | A1* | 5/2019 | Ando | H10D 64/679 |
| 2021/0202758 | A1* | 7/2021 | Yeong | H10D 84/834 |
| 2021/0234017 | A1* | 7/2021 | Yao | H10D 64/017 |
| 2022/0376088 | A1* | 11/2022 | Lin | H10D 64/018 |

* cited by examiner

B-B'

C-C'

C-C'

B-B'

C-C'

B-B'

C2

C-C'

C2

SEMICONDUCTOR STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
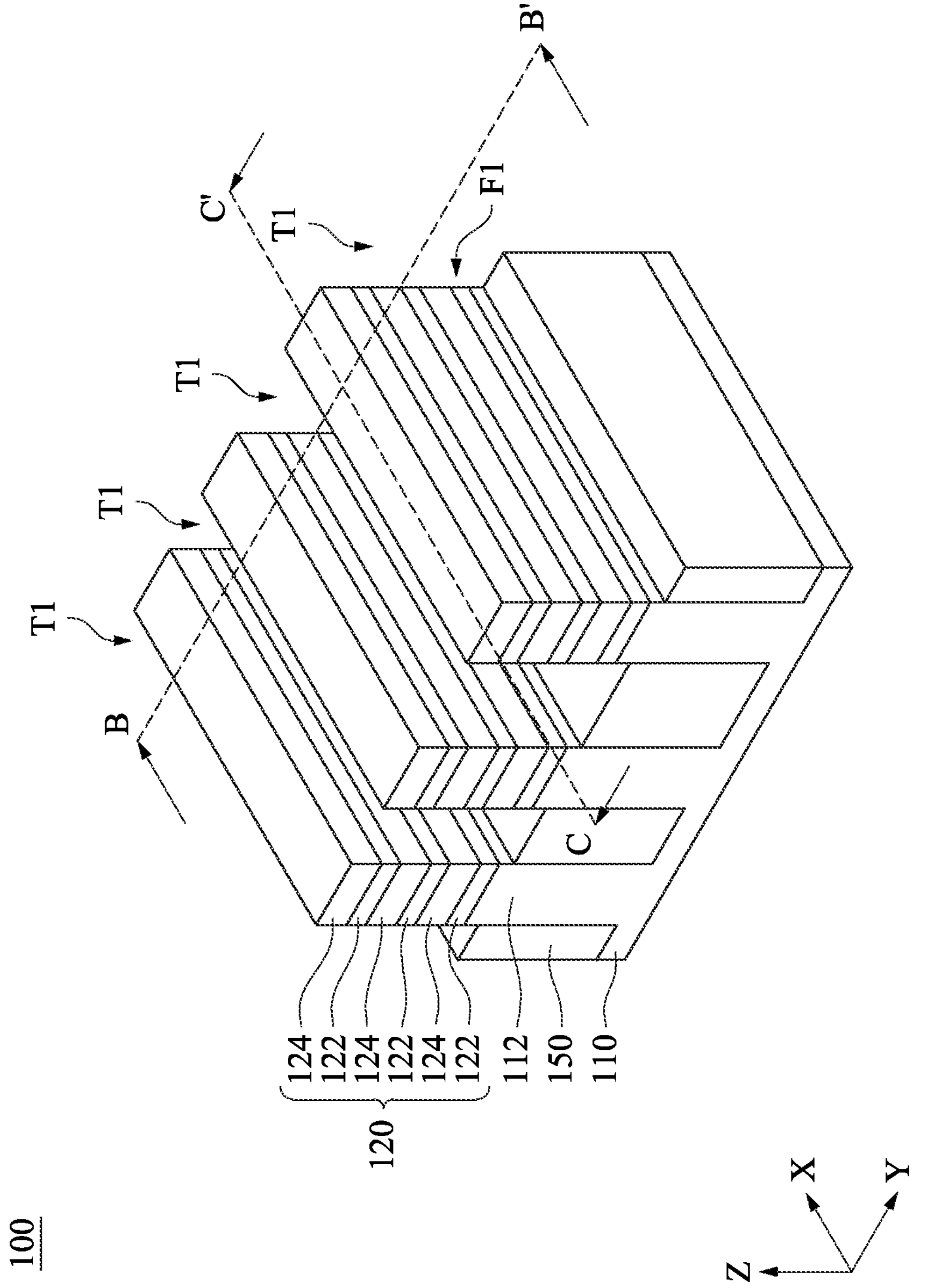
FIGS. 1A-19E illustrate schematic views of intermediate stages of semiconductor structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the down-scaling of the integrated circuits.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution of nanosheet process in a transistor, an inner spacer can act as an isolation feature between the metal gate and the source/drain region, and the inner spacer may be filled with dielectric material having dielectric constant ranging between about 2 to 5. The higher the dielectric constant of the inner spacer, the more charge a material can store, which in turn leads to higher capacitance in the transistor. Therefore, the challenge arises due to the elevated capacitance formed between the metal gate and the source/drain region. Increased capacitance in the transistor can slow down the switching speeds of the devices, leading to reduced overall performance.

Therefore, the present disclosure in various embodiments provides an inner spacer with an air gap that that is adjacent to the high-k gate dielectric layer. In some embodiments, the high-k gate dielectric layer can be in contact with the air gap inner spacer. Since air has a dielectric constant close to 1, it results in a reduction in capacitance. Specifically, by integrating this air gap, there's a reduction in the capacitance between the metal gate and the source/drain region, specifically a decrease greater than about 3.5%. The use of air gaps in this manner can lead to improved efficiency and performance of electronic devices by minimizing parasitic capacitance.

Reference is made to FIGS. 1A-19E. FIGS. 1A-19E illustrate schematic views of intermediate stages in the formation of a semiconductor structure 100 in accordance with some embodiments. In addition to the semiconductor structure 100, FIGS. 1A-19E depict X-axis, Y-axis, and Z-axis directions. It is understood that additional operations can be provided before, during, and after the processes shown by FIGS. 1A-19E, and some of the operations described below can be replaced or eliminated, for additional embodiments of the method. The order of the operations/processes may be interchangeable.

Figure 1B:
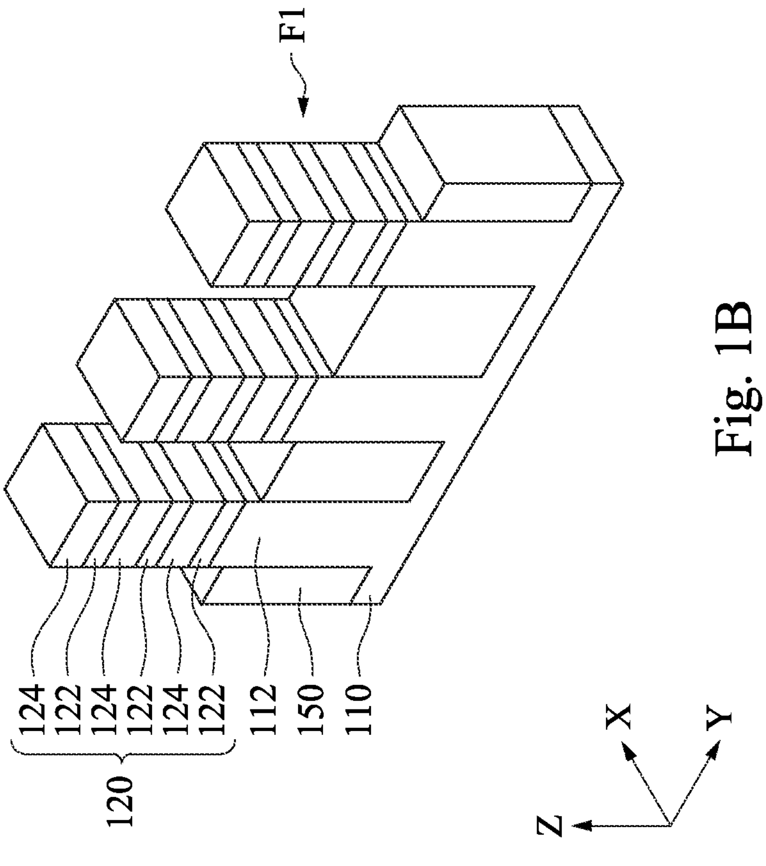
Figure 1C:
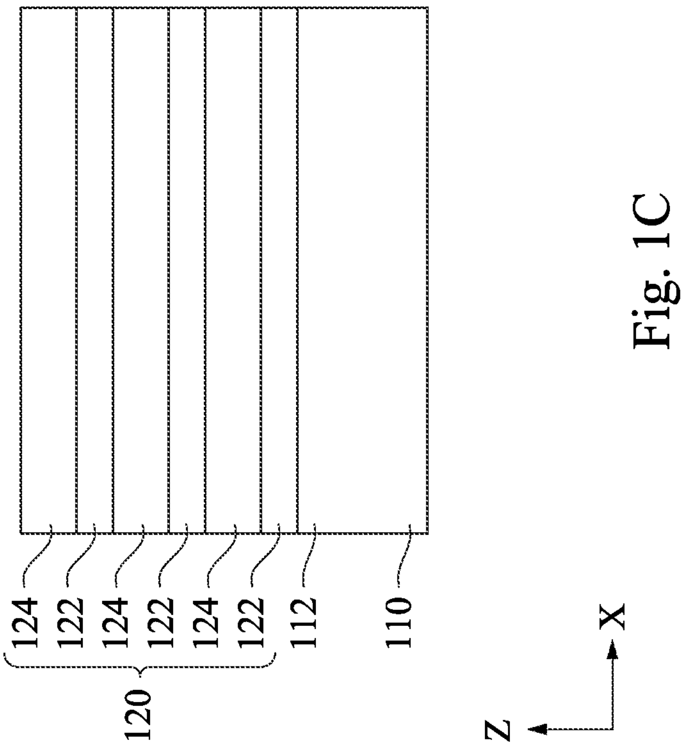
Figure 2A:
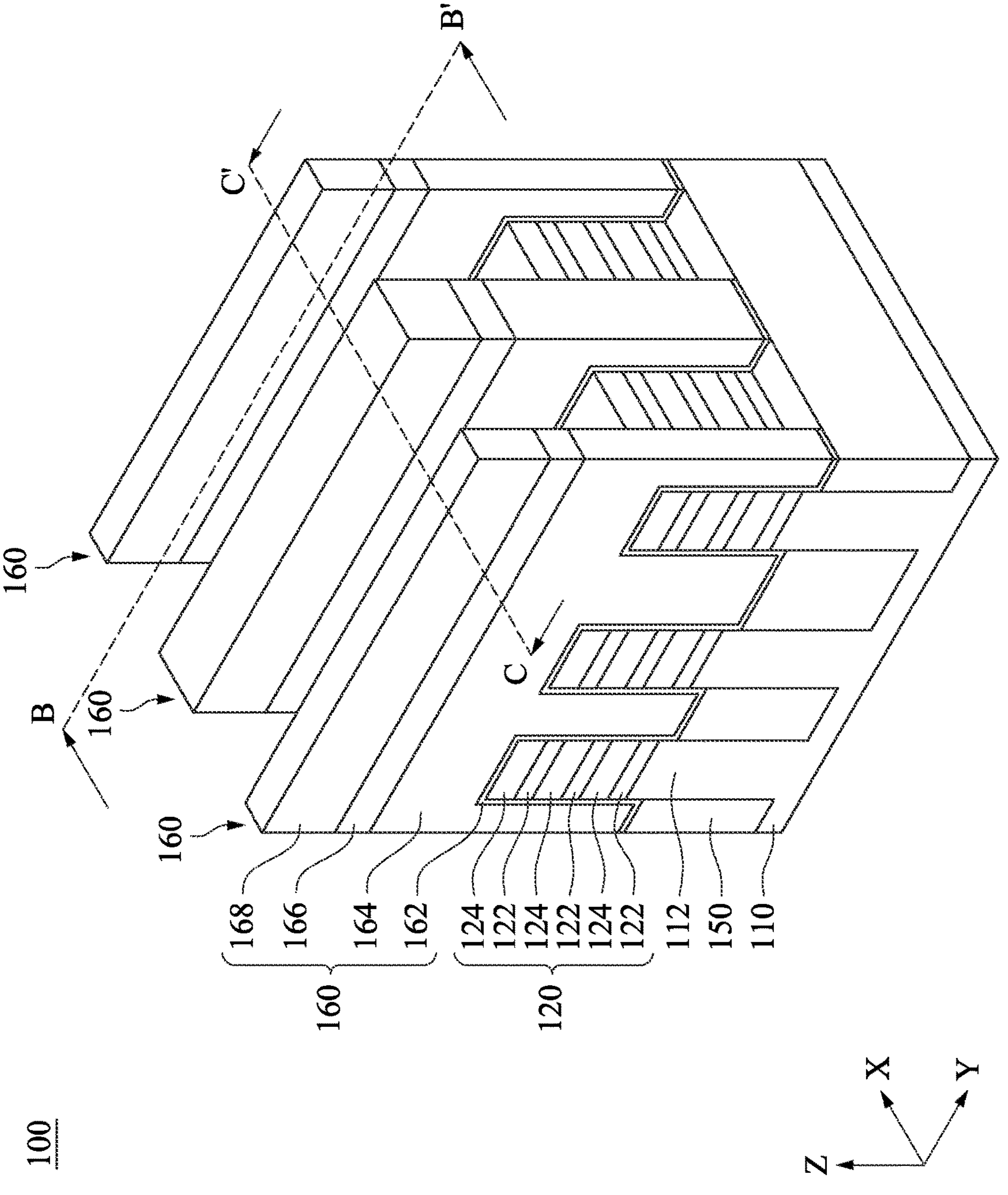
Figure 2C:
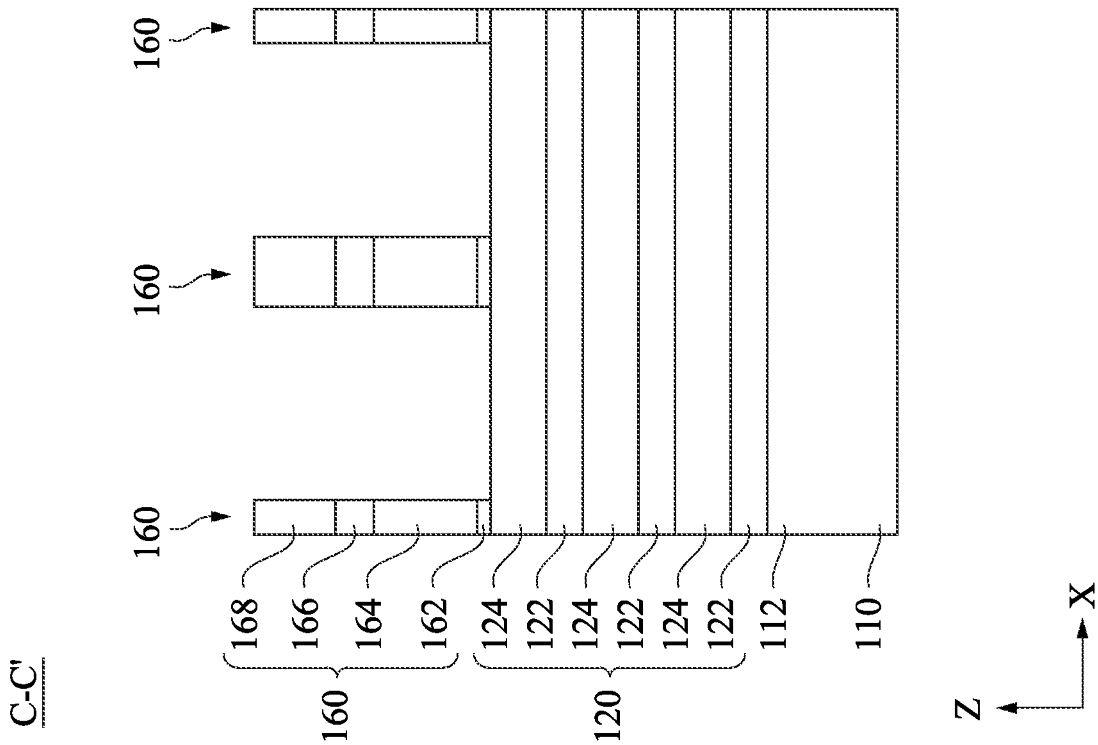
Figure 2B:
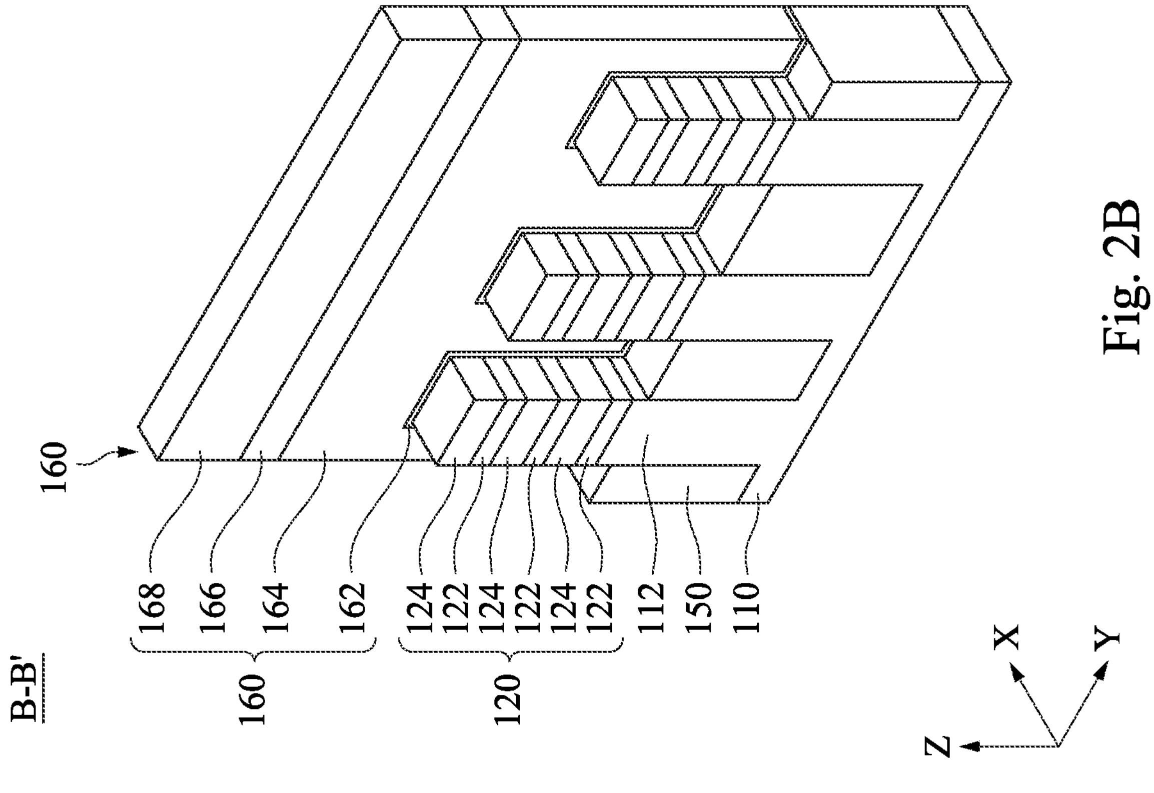
Figure 3A:
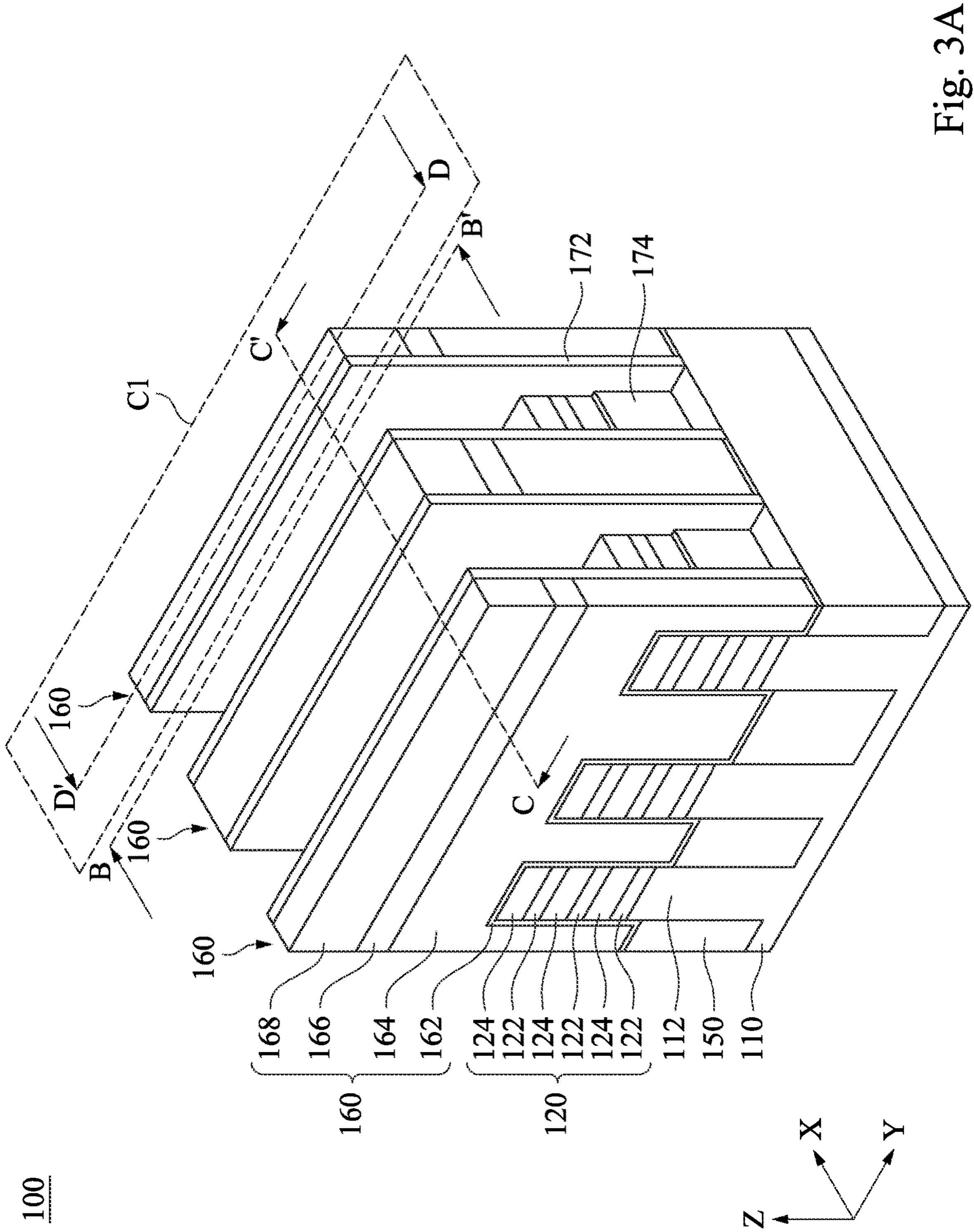
Figure 19B:
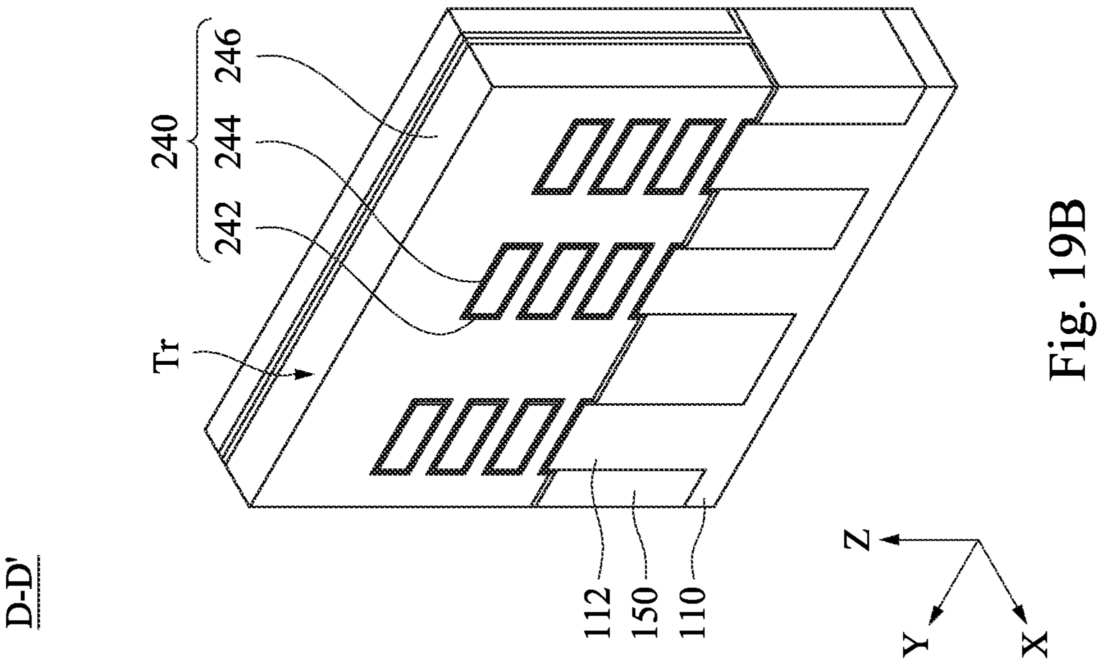
Figure 19A:
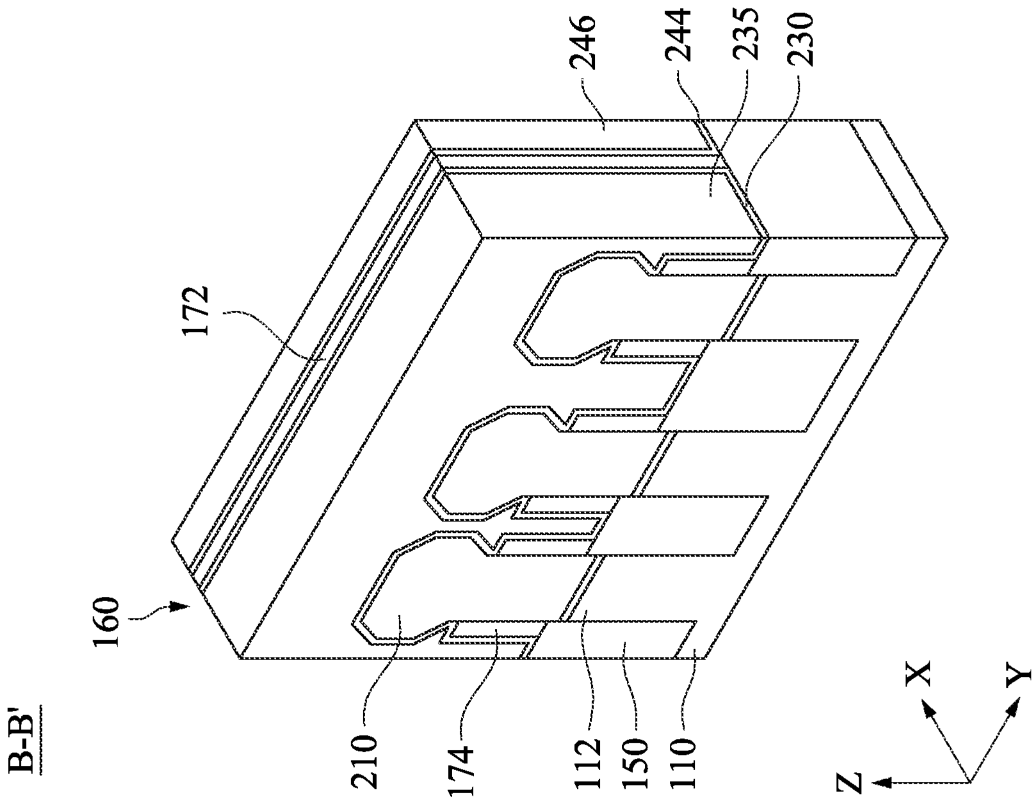
Figure 19D:
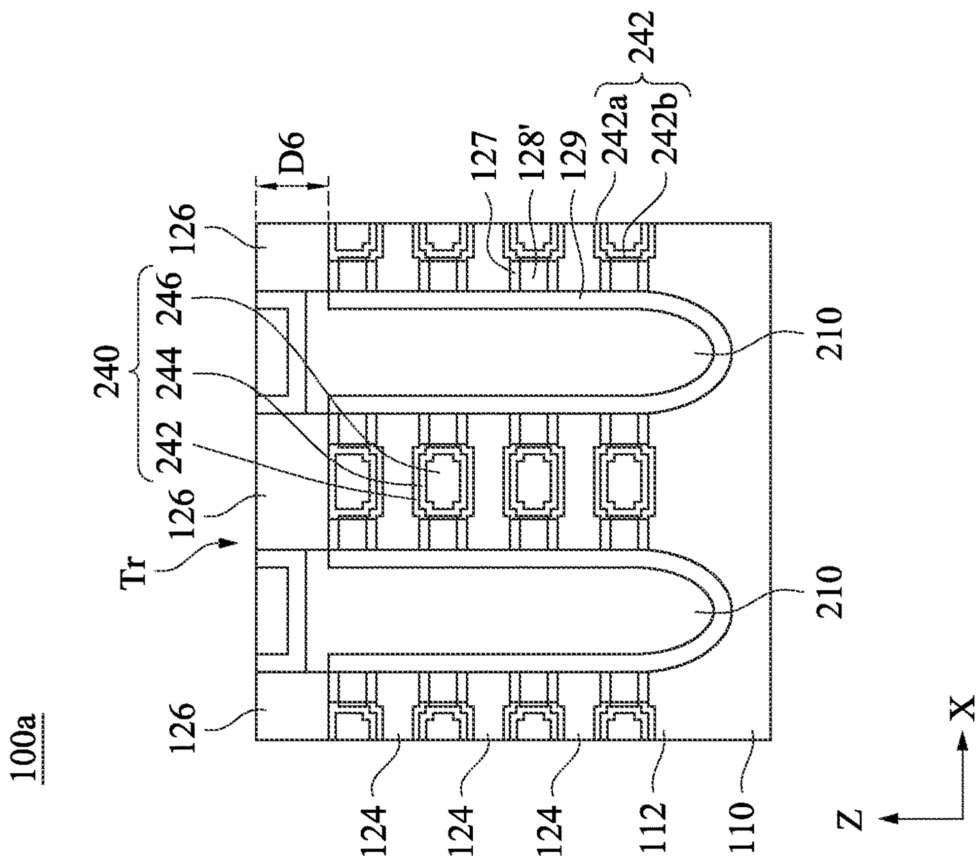
Figure 19C:
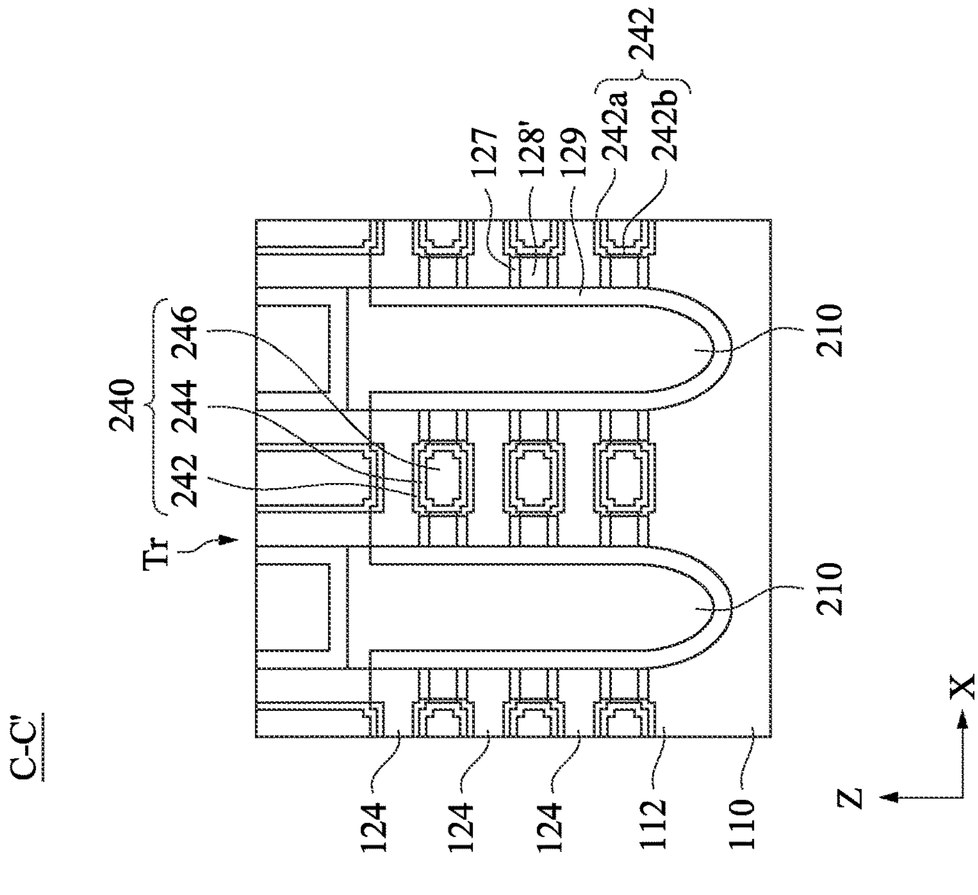
Figure 19E:
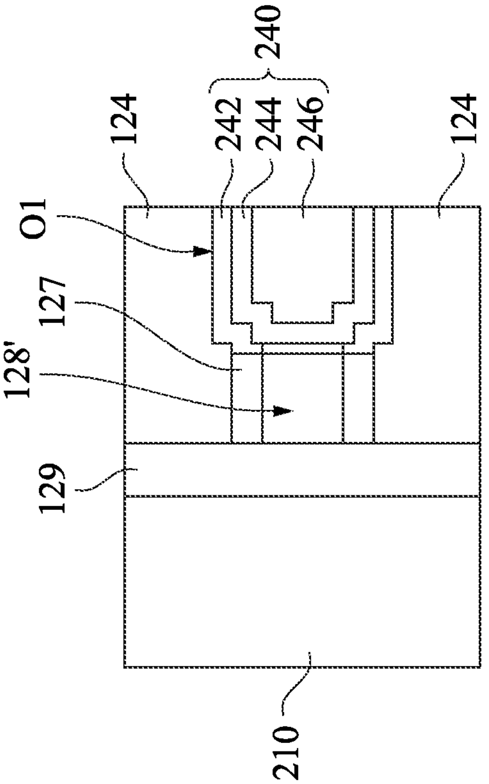

FIGS. 1A, 2A, and 3A are perspective views in the formation of the semiconductor structure 100 in accordance with some embodiments. FIGS. 1B, 2B, 3B, 4A, 5A, 6A, 7A, 8A, 9A, 10A, 11A, 12A, 13A, 13B, 14A, 15A, 16A, 17A, 18A, and 19A are cross-sectional perspective views taken along line B-B' as shown in FIGS. 1A, 2A, and 3A, in which a part of the semiconductor structure 100 in FIG. 13B is omitted for the purpose of clarity. FIGS. 1C, 2C, 3C, 4B, 5B, 6B, 7B, 8B, 9B, 10B, 11B, 12B, 13D, 14C, 15C, 16C, 17C, 18C, and 19C are cross-sectional perspective views taken along line C-C' as shown in FIGS. 1A, 2A, and 3A. FIGS. 13C, 14B, 15B, 16B, 17B, 18B, 19B are cross-sectional views taken along line D-D' as shown in FIG. 3A in region C1. FIGS. 13E, 14D, 15D, 16D, 17D, 18D, 19E are local enlarged view of a region C2 in FIGS. 13D, 14C, 15C, 16C, 17C, 18C, and 19C. FIG. 19D is a cross-sectional view of a semiconductor structure corresponding FIG. 19C according to some embodiments of the present disclosure.

Reference is made to FIGS. 1A-1C. A substrate 110 is provided. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure. In some embodiments, the substrate 110 can be interchangeably referred to as a semiconductor substrate.

A semiconductor stack 120 is formed on the substrate 110 through epitaxy, such that the semiconductor stack 120 forms crystalline layers. The semiconductor stack 120 includes semiconductor layers 122 and 124 stacked alternatively. There may be two, three, four, or more of the semiconductor layers 122 and 124. The semiconductor layers 122 may be silicon germanium (SiGe) layers. The semiconductor layers 124 may be pure silicon layers that are free from germanium. The semiconductor layers 124 may also be substantially pure silicon layers, for example, with a germanium percentage lower than about 1 percent. Furthermore, the semiconductor layers 124 may be intrinsic, which are not doped with p-type and n-type impurities. In some other embodiments, however, the semiconductor layers 124 can be silicon germanium or germanium for p-type semiconductor device, or can be III-V materials, such as InAs, InGaAs, InGaAsSb, GaAs, InPSb, or other suitable materials.

The semiconductor layers 124 or portions thereof may form nanostructure channel(s) of nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are fork-sheets, nanosheets, nanowires, nanoslabs, or nanorings, depending on their geometry. The use of the semiconductor layers 124 to define a channel or channels of the semiconductor device is further discussed below. In some embodiments, the semiconductor layer 124 can be interchangeably referred to as a channel region, a channel pattern, a channel structure, a nanostructure, or a semiconductor sheet.

As described above, the semiconductor layers 124 may serve as channel region(s) for a subsequently-formed semiconductor device and the thickness is chosen based on device performance considerations. The semiconductor layers 122 in channel regions(s) may eventually be removed and serve to define a vertical distance between adjacent channel region(s) for a subsequently-formed multi-gate device and the thickness is chosen based on device performance considerations. Accordingly, the semiconductor layers 122 may also be referred to as sacrificial layers, and the semiconductor layers 124 may also be referred to as channel layers.

The semiconductor stack 120 and the substrate 110 are patterned using to form trenches T1. Accordingly, a plurality of fin structures (or semiconductor strips or active regions) F1 are formed. The trenches T1 extend into the substrate 110 and have lengthwise directions substantially parallel to each other. The trenches T1 form protrusion structures 112 in the substrate 110, where the protrusion structures 112 protrude from the substrate 110, and the fin structures F1 are respectively formed above the protrusion structures 112 of the substrate 110. In some embodiments, the protrusion structure 112 can be interchangeably referred to as a fin structure or a strip structure.

Isolation structures 150, such as shallow trench isolations (STI), are disposed in the trenches T1 and over the substrate 110. The isolation structures 150 can be equivalently referred to as an isolation insulating layer in some embodiments. The isolation structures 150 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 150 are formed through a process such as CVD, flowable CVD (FCVD), or a spin-on-glass process, although any acceptable process may be utilized. Subsequently, portions of the isolation structures 150 extending over the top surfaces of the fin structures F1 are removed using, for example, an etching back process, chemical mechanical polishing (CMP), or the like.

Subsequently, the isolation structures 150 are recessed and around at least portions of the protrusion structures 112, such that at least portions of the semiconductor stacks 120 protrude from between adjacent isolation structures 150. In some embodiments, the top surfaces of the isolation structures 150 are coplanar (within process variations) with the top surfaces of the protrusion structures 112. In some embodiments, the top surfaces of the isolation structures 150 are above or below the top surfaces of the protrusion structures 112. The isolation structures 150 separate the features of adjacent devices. In some embodiments, the isolation structures 150 are recessed using a single etch processes, or multiple etch processes. In some embodiments in which the isolation structures 150 is made of silicon oxide, the etch process may be, for example, a dry etch, a chemical etch, or a wet cleaning process. For example, the chemical etch may employ fluorine-containing chemical such as dilute hydrofluoric (dHF) acid. In some embodiments, the space defined by isolation structure 150 can be called an isolation space.

Reference is made to FIGS. 2A-2C. Dummy gate structures 160 are formed to extend across the semiconductor stack 120 and the protrusion structures 112. The dummy gate structures 160 may include a gate dielectric layer 162, a dummy gate electrode layer 164 over the gate dielectric layer 162, and dielectric layers 166 and 168 over the dummy gate electrode layer 164. Specifically, the gate dielectric layer 162 can be blanket formed over the substrate 110 to cover the semiconductor stack 120, the protrusion structures 112, and the isolation structures 150. In some embodiments, the gate dielectric layer 162 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the gate dielectric layer 162 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 162 is an oxide layer. The gate dielectric layer 162 may be formed by a deposition processes, such as chemical vapor deposition (CVD), physical vapor deposition (PVD), atomic layer deposition (ALD), plasma enhanced CVD (PECVD) or other suitable techniques.

Subsequently, a dummy gate electrode layer 164 is formed over the gate dielectric layer 162. In some embodiments, the dummy gate electrode layer 164 may include polycrystalline-silicon (poly-Si), poly-crystalline silicon-germanium (poly-SiGe), metallic nitrides, metallic silicides, metallic oxides, or metals. In some embodiments, the dummy gate electrode layer 164 includes a metal-containing material such as TiN, TaN, TaC, Co, Ru, Al, combinations thereof, or multi-layers thereof. The dummy gate electrode layer 164 may be deposited by CVD, physical vapor deposition (PVD), sputter deposition, or other techniques suitable for depositing conductive materials.

Subsequently, dielectric layers 166 and 168 are formed on the dummy gate electrode layer 164 in sequence. In some embodiments, the dielectric layer 168 may be made of a different material than the dielectric layer 166. In some embodiments, the dielectric layer 166 may be made of a nitrogen-containing material, and the dielectric layer 168 may be made of a nitrogen-free material. By way of example and not limitation, the dielectric layer 166 may be made of a silicon carbo-nitride (SiCN), and the dielectric layer 168 may be made of silicon oxide ($SiO_2$). In some embodiments, the dielectric layer 166 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the dielectric layer 168 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers.

Subsequently, a patterned mask layer (not shown) is formed over the dielectric layer 168 and then patterned to form separated mask portions. The patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). One or more etching processes are performed to form dummy gate structure 160 wrapping around the semiconductor stack 120 and the protrusion structures 112 using the patterned mask as an etching mask, and the patterned mask layer may be removed after the etching. The dummy gate structures 160 have substantially parallel longitudinal axes that are substantially perpendicular to a longitudinal axis of the semiconductor stack 120. The dummy gate structure 160 will be replaced with a replacement gate structure using a "gate-last" or replacement-gate process. In some embodiments, the dummy gate structure 160 can be interchangeably referred to a gate pattern or a gate strip.

Figure 3C:
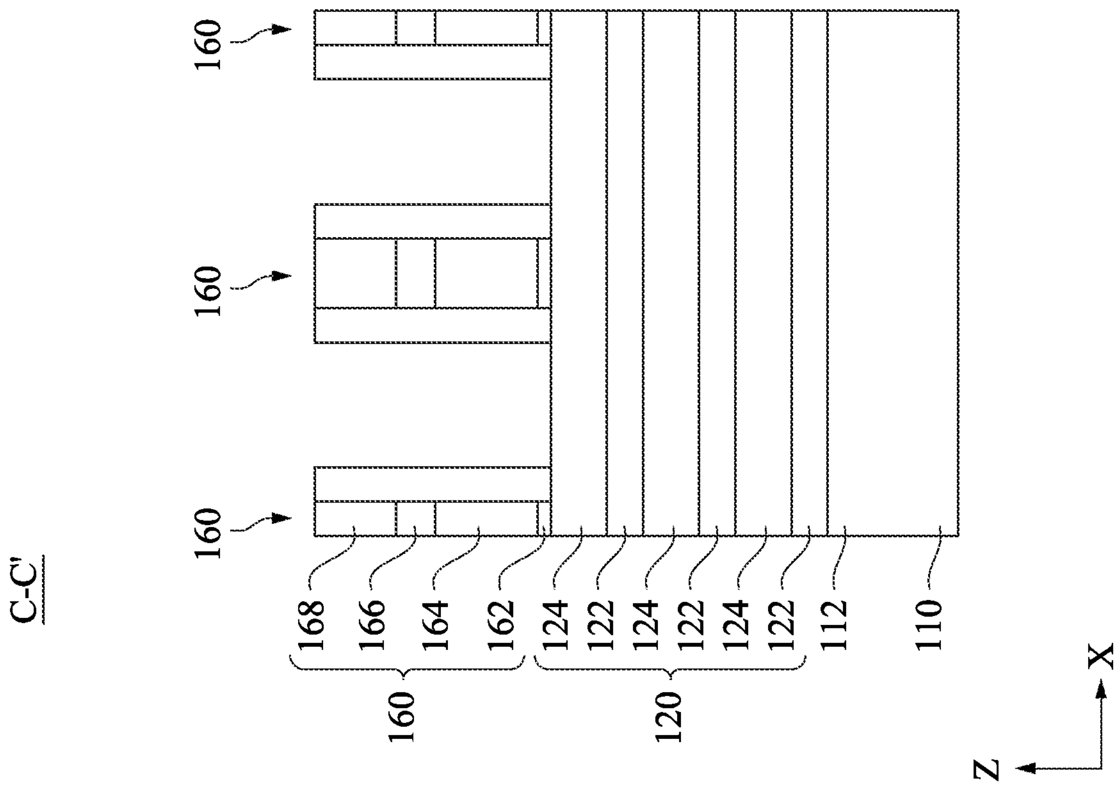
Figure 3B:
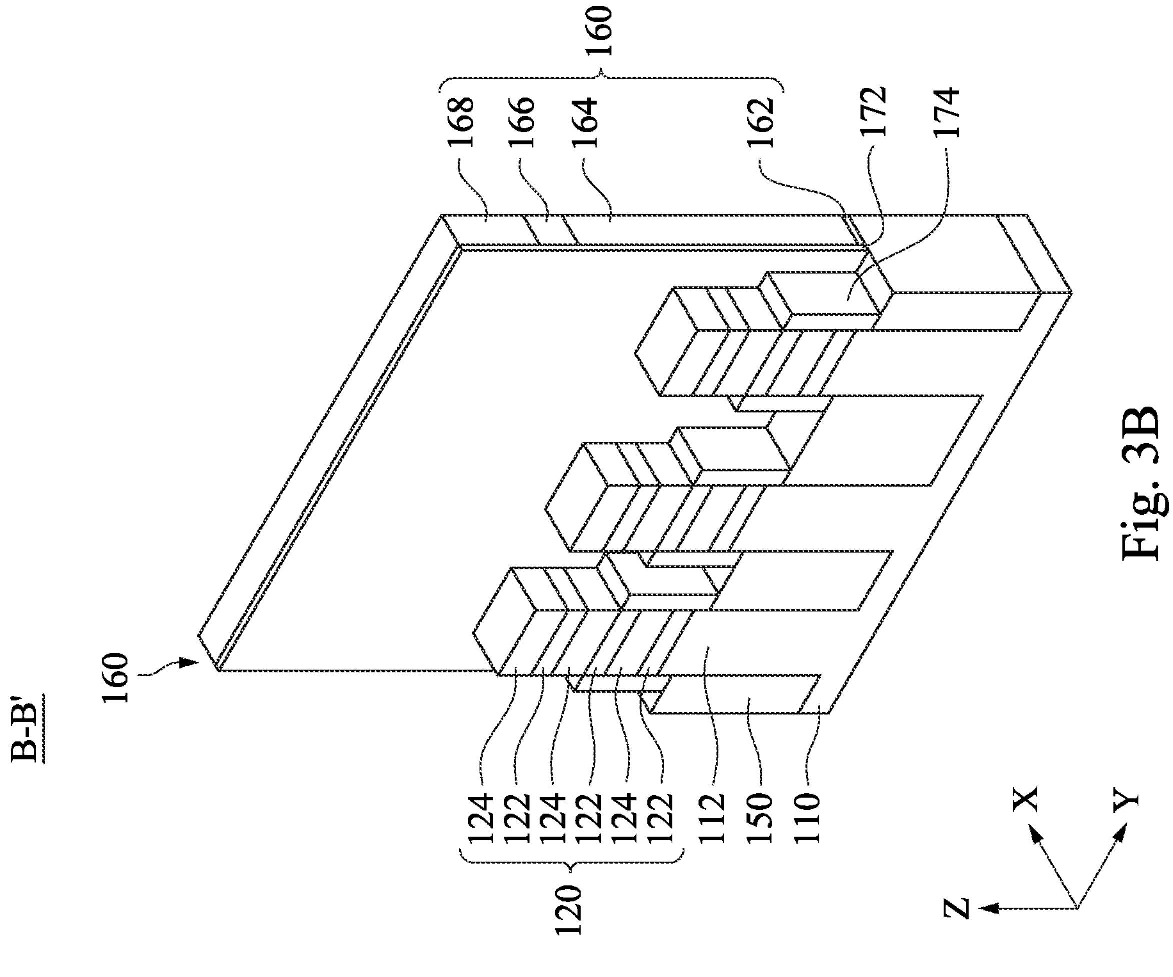

Reference is made to FIGS. 3A-3C. After formation of the dummy gate structures 160 is completed, gate spacers 172 are formed on sidewalls of the dummy gate structures 160 and sidewall spacers 174 are formed on sidewalls of the semiconductor stack 120. Specifically, a dielectric film can be deposited on the structure as illustrated in FIGS. 3A-3C. The dielectric film may be silicon nitride (SiN), silicon carbonoxide (SiCO), silicon carbonitride (SiCN), silicon oxycarbonitride (SiOCN), or the like. The dielectric film can be conformally formed on the substrate 110, the dummy gate structures 160, and the fin structures F1. In some embodiments, the dielectric film may be a single layer or multiple layers.

Subsequently, an anisotropic etching process is then performed on the deposited dielectric film to expose portions of the fin structures F1 not covered by the dummy gate structure 160 (e.g., in source/drain regions of the fin structures F1). Portions of the dielectric materials directly above the dummy gate structures 160 may be completely removed by this anisotropic etching process. Portions of the dielectric materials on sidewalls of the dummy gate structures 160 may remain, forming gate sidewall spacers, which are denoted as the gate spacers 172, for the sake of simplicity. Further, sidewall spacers 174, which are remaining parts of the dielectric film that are not removed in the operation of the anisotropic etching process, exist. Specifically, when the dielectric film is etched to form the gate spacers 172, portions of the dielectric film on sidewalls of the fin structures F1 are pullback-etched. Portions of the dielectric film thus remain at corners between the isolation structure 150 and the fin structures F1 after the etching and form the sidewall spacers 174.

In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 4B:
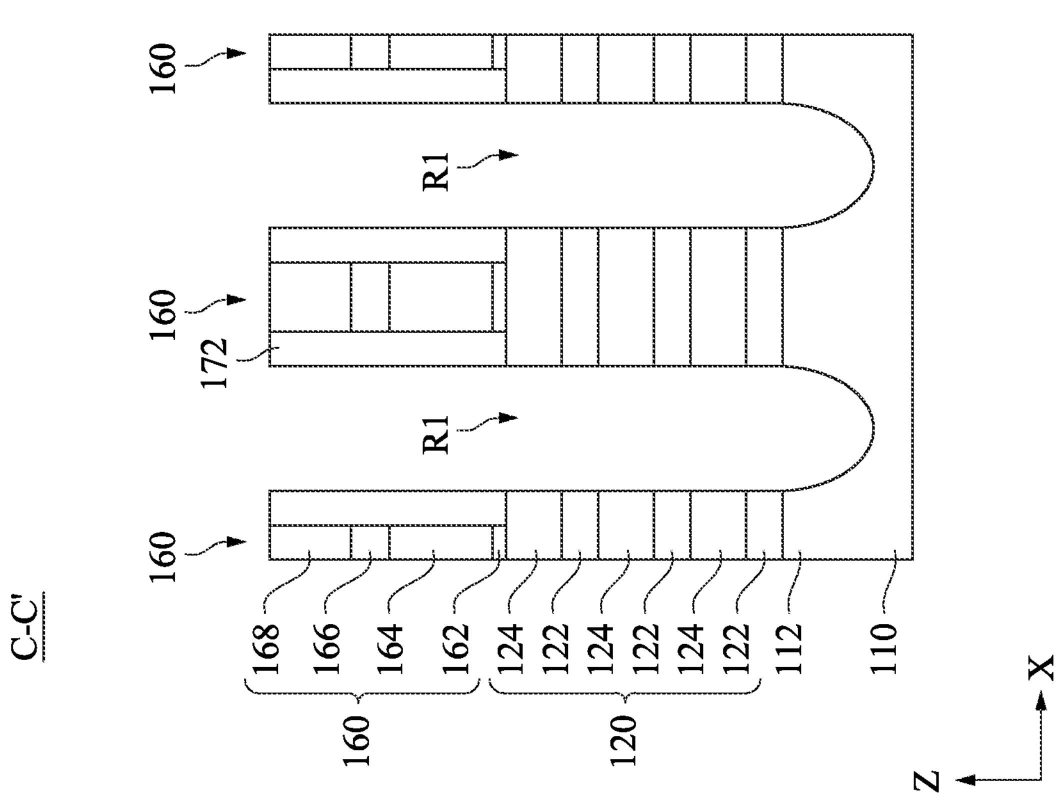
Figure 4A:
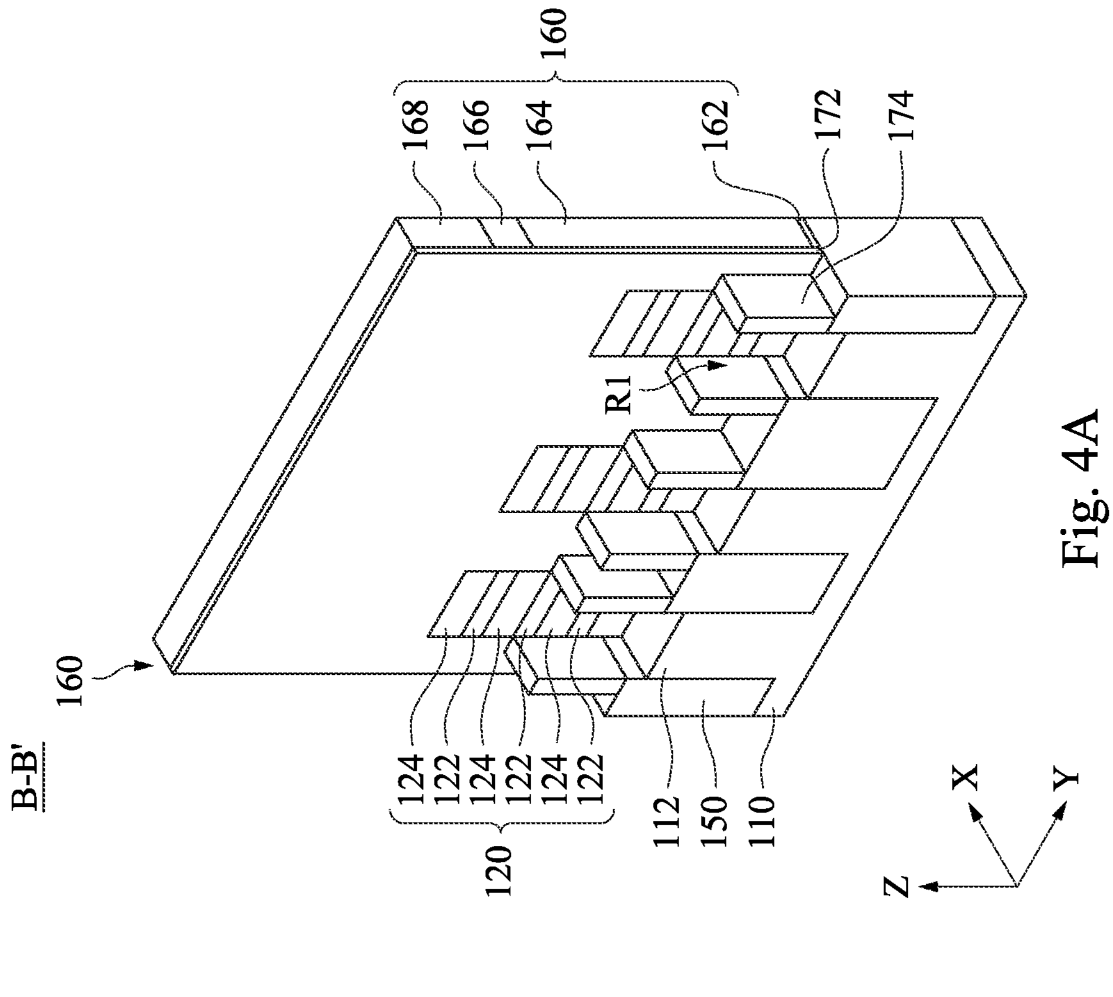

Reference is made to FIGS. 4A and 4B. An anisotropic etching process may etch exposed portions of the fin structures F1 that extend laterally beyond the gate spacers 172 (e.g., in the source/drain regions of the fin structures F1), resulting in recesses R1 into the fin structures F1 and between corresponding dummy gate structures 160. After the anisotropic etching, end surfaces of the semiconductor layers 122 and 124 are aligned with respective outermost sidewalls of the gate spacers 172, due to the anisotropic etching. In some embodiments, the protrusion structures 112 are also recessed.

In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 5B:
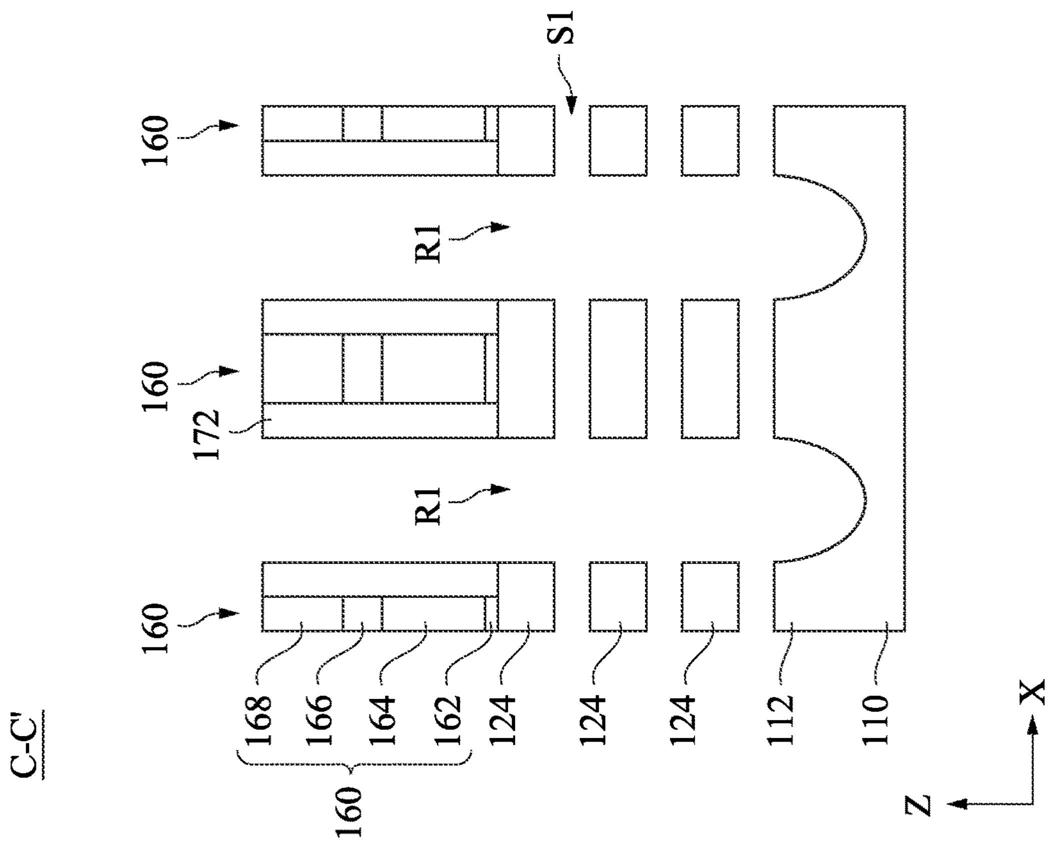
Figure 5A:
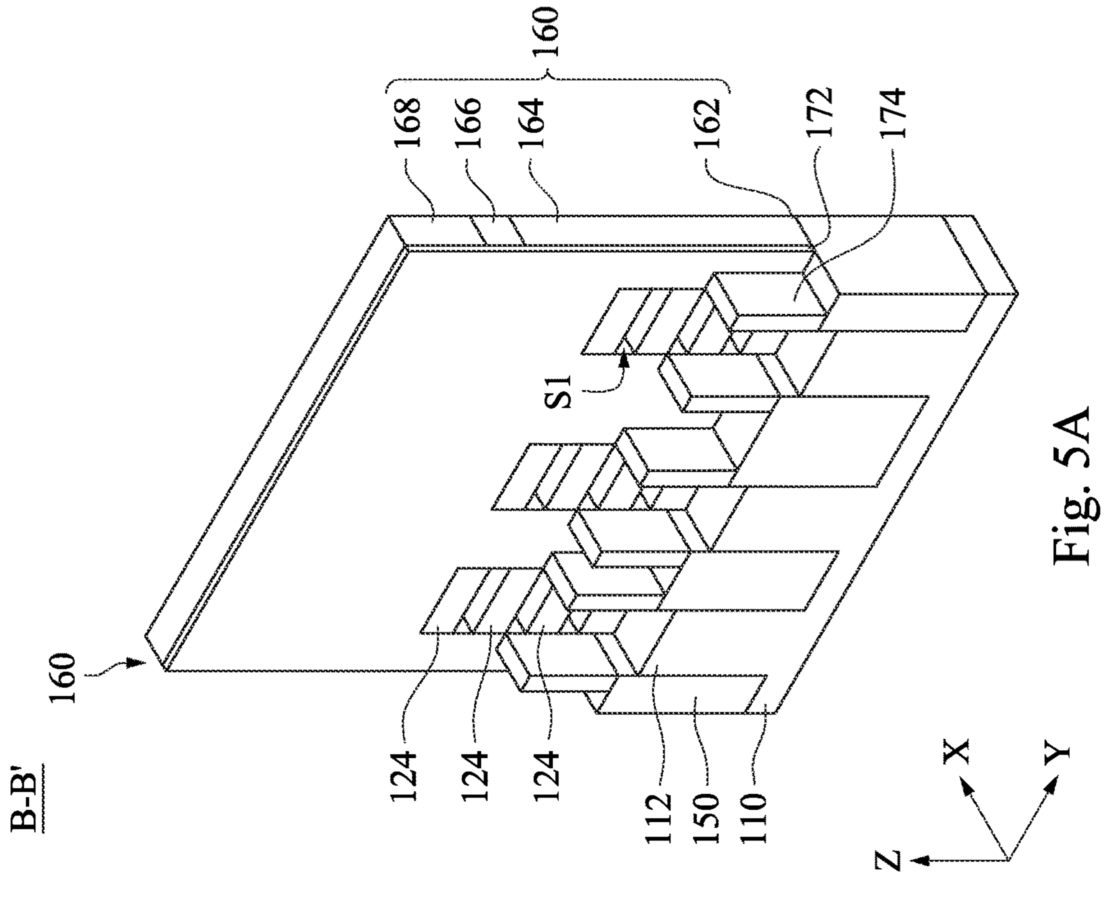

Reference is made to FIGS. 5A and 5B. The semiconductor layers 122 are removed by using suitable etch techniques, resulting in lateral spaces S1 each vertically between corresponding semiconductor layers 124. This operation may be performed by using a selective etching process. By way of example and not limitation, the semiconductor layers 122 can be silicon germanium (SiGe) and the semiconductor layers 124 can be made of silicon (Si), allowing for the selective etching of the semiconductor layers 122. In other words, the selective etching etches the semiconductor layers 122 at a faster etch rate than it etches the semiconductor layers 124, and thus the semiconductor layers 122 can be completely removed while the semiconductor layers 124 can be only partially removed. In some embodiments, the selective wet etching includes an APM etch (e.g., ammonia hydroxide-hydrogen peroxide-water mixture) that etches silicon germanium at a faster etch rate than it etches silicon.

Figure 6B:
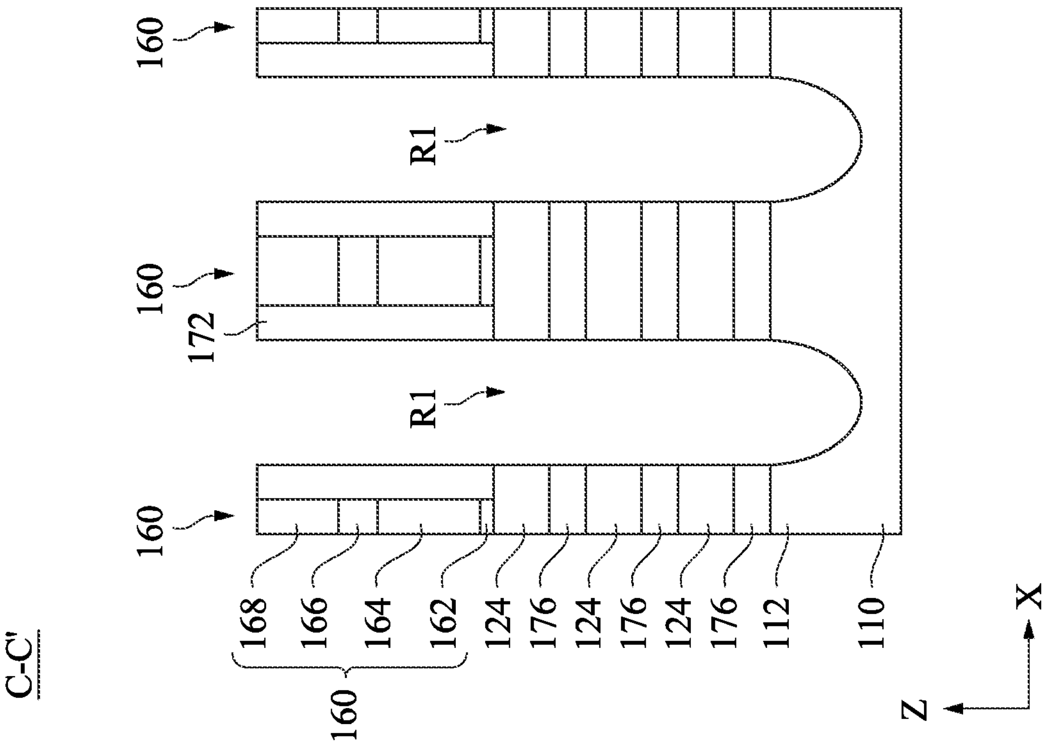
Figure 6A:
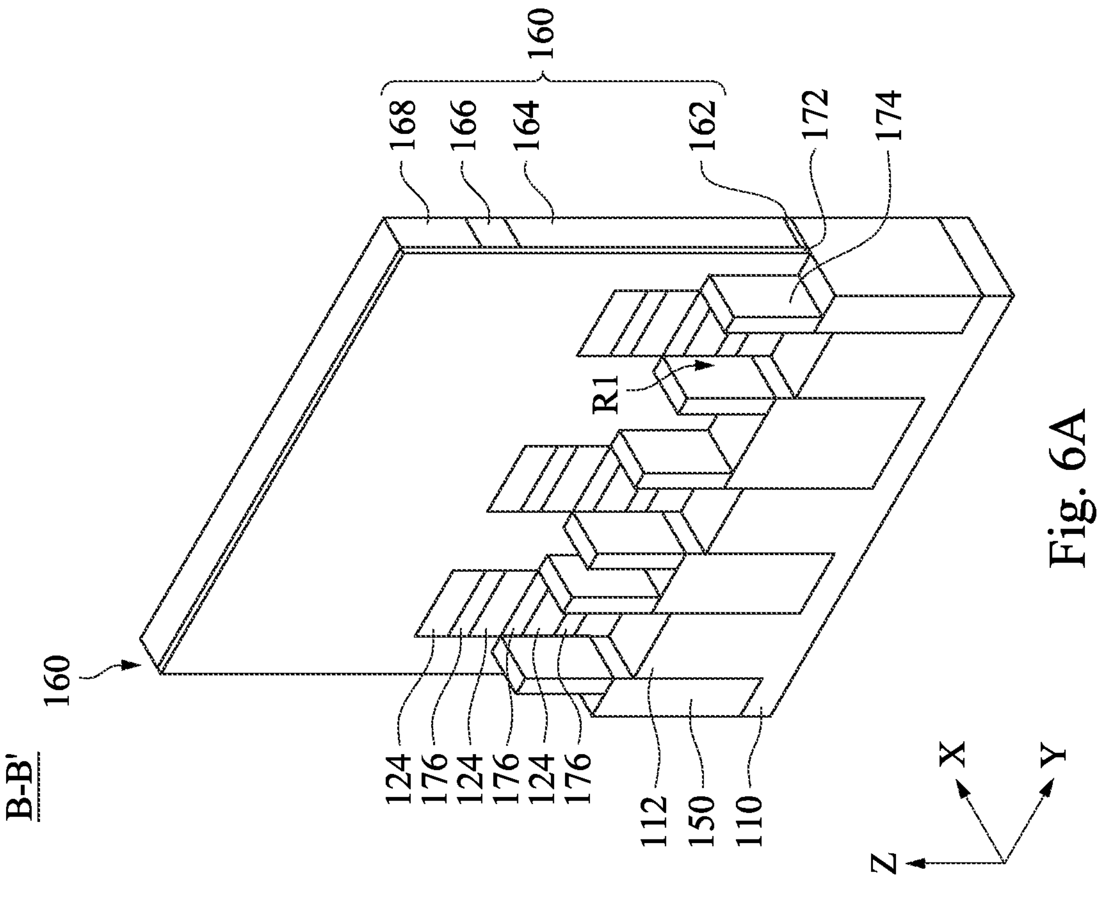

Reference is made to FIGS. 6A and 6B. Dielectric interposers 176 are then formed in the spaces S1. For example, a dielectric material layer is formed to fill the spaces S1 left by the etching of the semiconductor layers 122. The dielectric material layer may be a low-k dielectric material, such as $SiO_2$, silicon nitride (SiN), silicon carbonoxide (SiCO), silicon carbonitride (SiCN), silicon oxycarbonitride (SiOCN). The inner spacer material layer can be formed using CVD, including LPCVD and PECVD, PVD, ALD, or other suitable processes. After the deposition of the dielectric material layer, an anisotropic etching process is performed to trim the deposited dielectric material layer, such that portions of the deposited dielectric material layer that fill the spaces S1 left by the etching of the semiconductor layers 122 are left. After the trimming process, the remaining portions of the deposited dielectric material are denoted as the dielectric interposer 176 for the sake of simplicity. The dielectric interposer 176 in channel regions(s) may eventually be removed and serve to define a vertical distance between adjacent channel region(s) for a subsequently-formed multi-gate device. Accordingly, the dielectric interposer 176 may also be referred to as a sacrificial layer or a disposable oxide interposer (DOI).

Figure 7B:
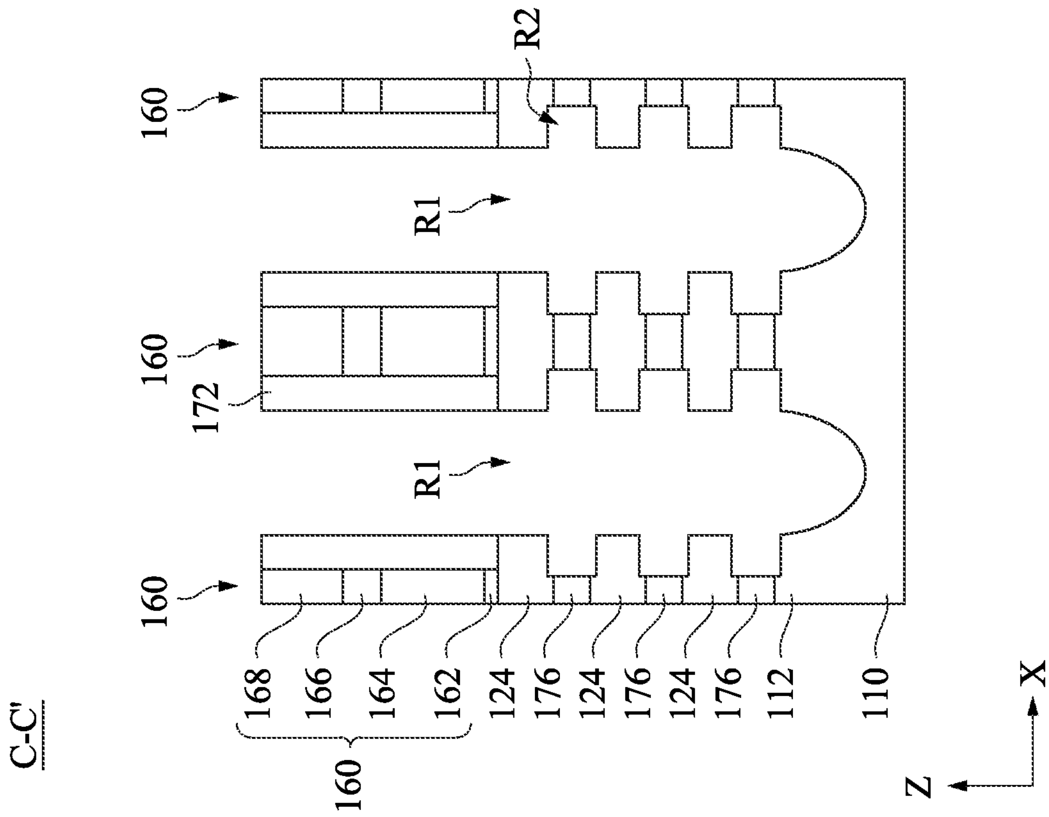
Figure 7A:
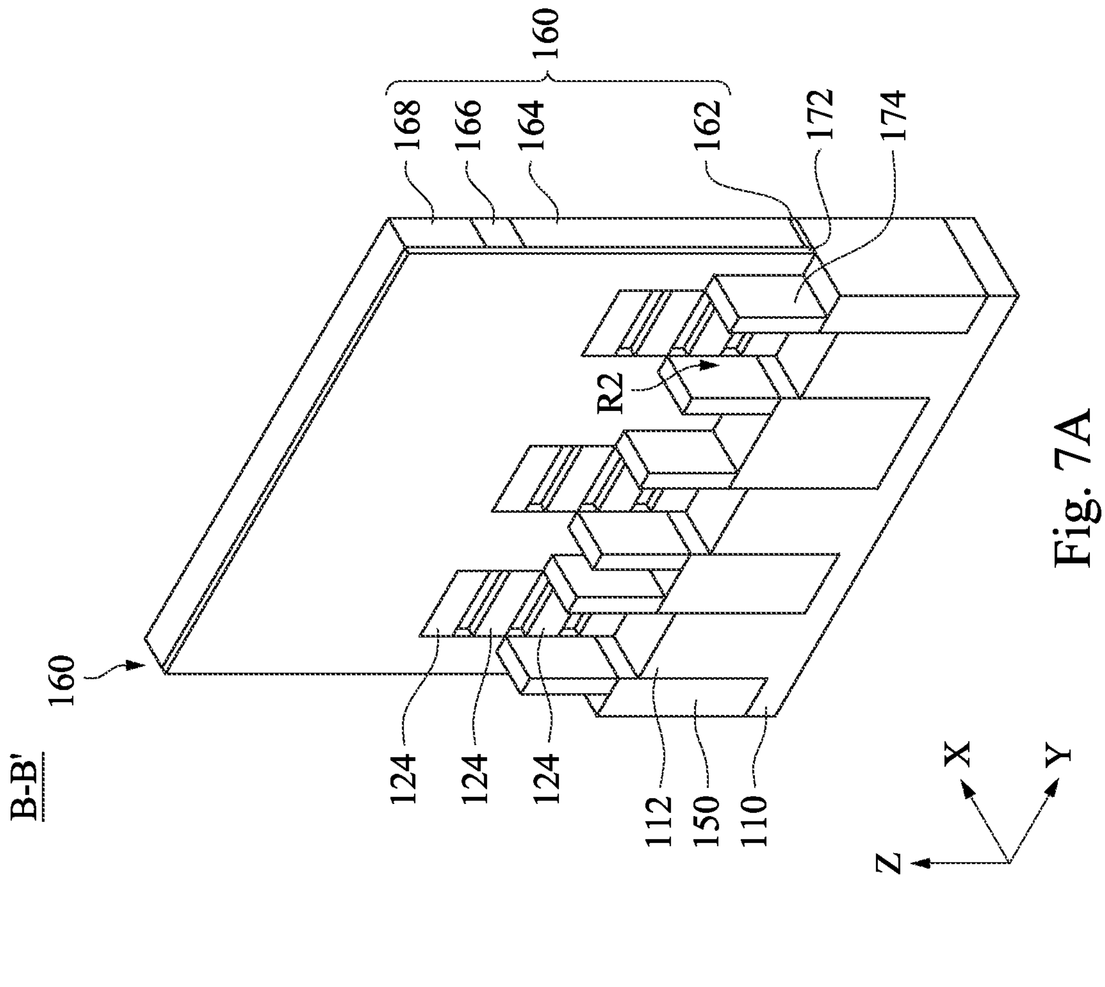

Reference is made to FIGS. 7A and 7B. The dielectric interposer 176 are laterally or horizontally recessed by using suitable etch techniques, resulting in lateral recesses R2 each vertically between corresponding semiconductor layers 124. This operation may be performed by using a selective etching process. As a result, the semiconductor layers 124 laterally extend past opposite end surfaces of the dielectric layers 176. In some embodiments, the etching process would consume the portions of the semiconductor layers 124, and thus semiconductor layers 124 may be trimmed as shown in FIGS. 7A and 7B. In some embodiments, the etching process may be, for example, a dry etch, a chemical etch, or a wet cleaning process. For example, the chemical etch may employ fluorine-containing chemical such as dilute hydrofluoric (dHF) acid.

Figure 8A:
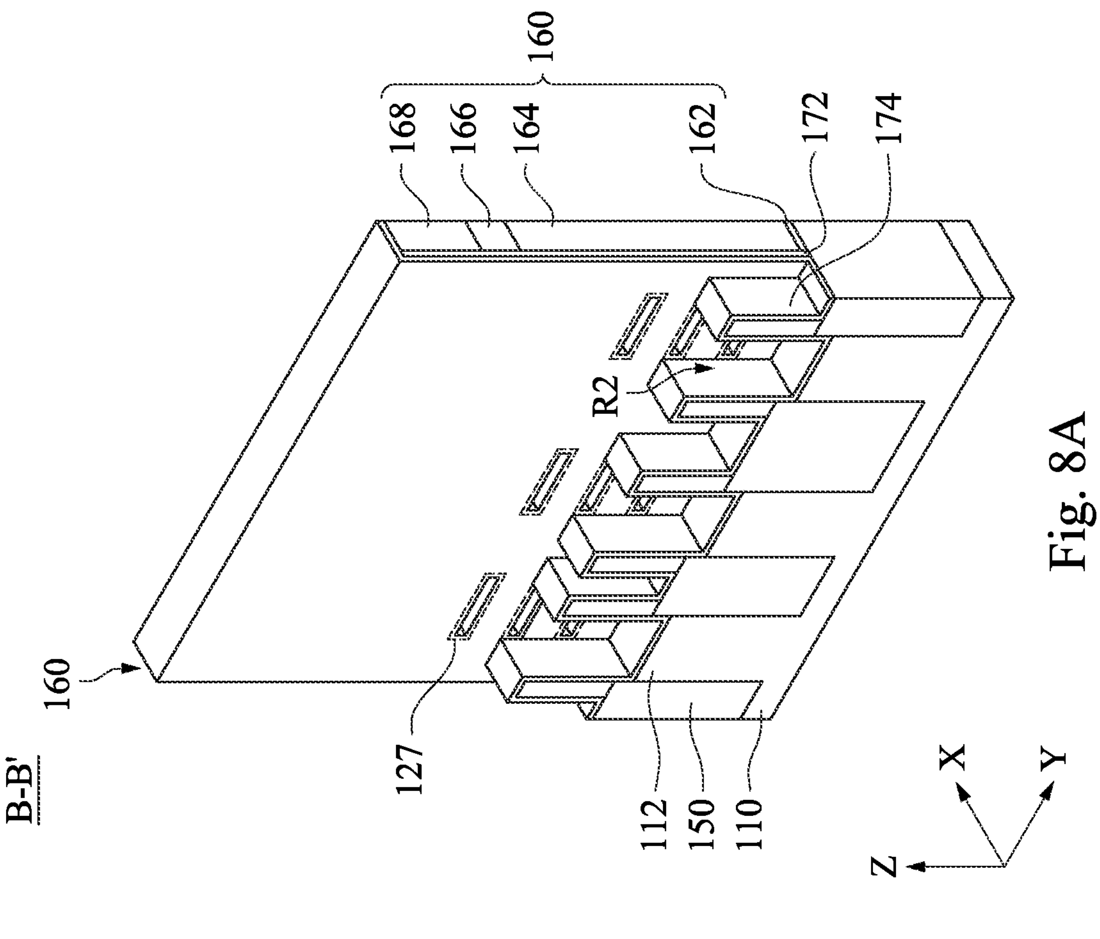
Figure 8B:
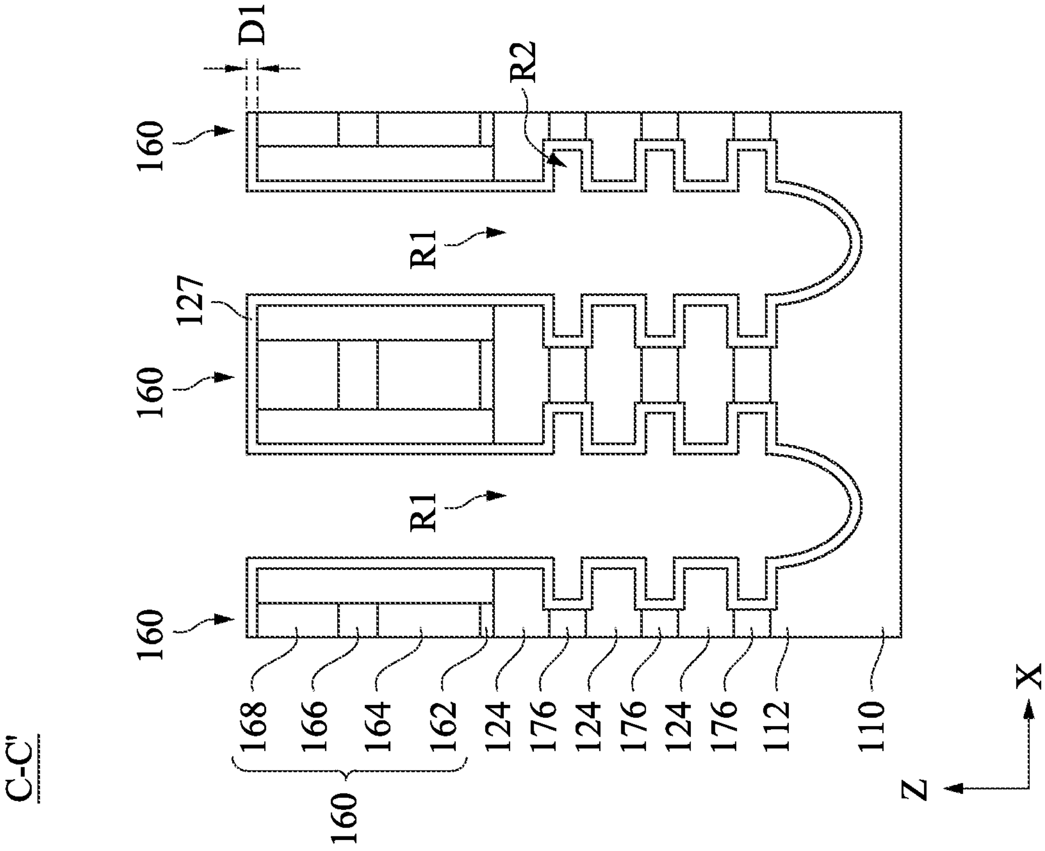

Reference is made to FIGS. 8A and 8B. A spacer layer 127 is conformally formed over the substrate 110 and in the recesses R1 and R2. In some embodiments, the spacer layer 127 has a thickness D1 in a range from about 0.5 to 3 nm, such as about 0.5, 1, 1.5, 2, 2.5, or 3 nm. In some embodiments, the spacer layer 127 can be made of dielectric material, such be silicon nitride (SiN), silicon carbonoxide (SiCO), silicon carbonitride (SiCN), silicon oxycarbonitride (SiOCN), or the like. The spacer layer 127 may be formed by a deposition processes, such as chemical vapor deposition (CVD), physical vapor deposition (PVD), atomic layer deposition (ALD), plasma enhanced CVD (PECVD) or other suitable techniques.

Figure 9B:
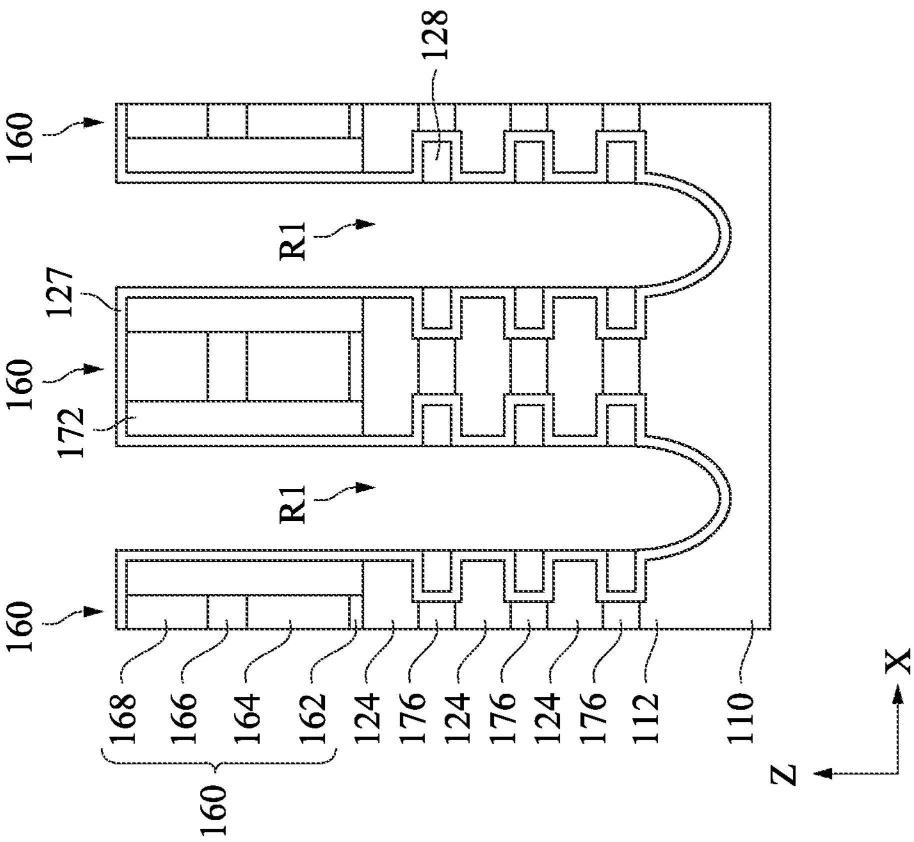
Figure 9A:
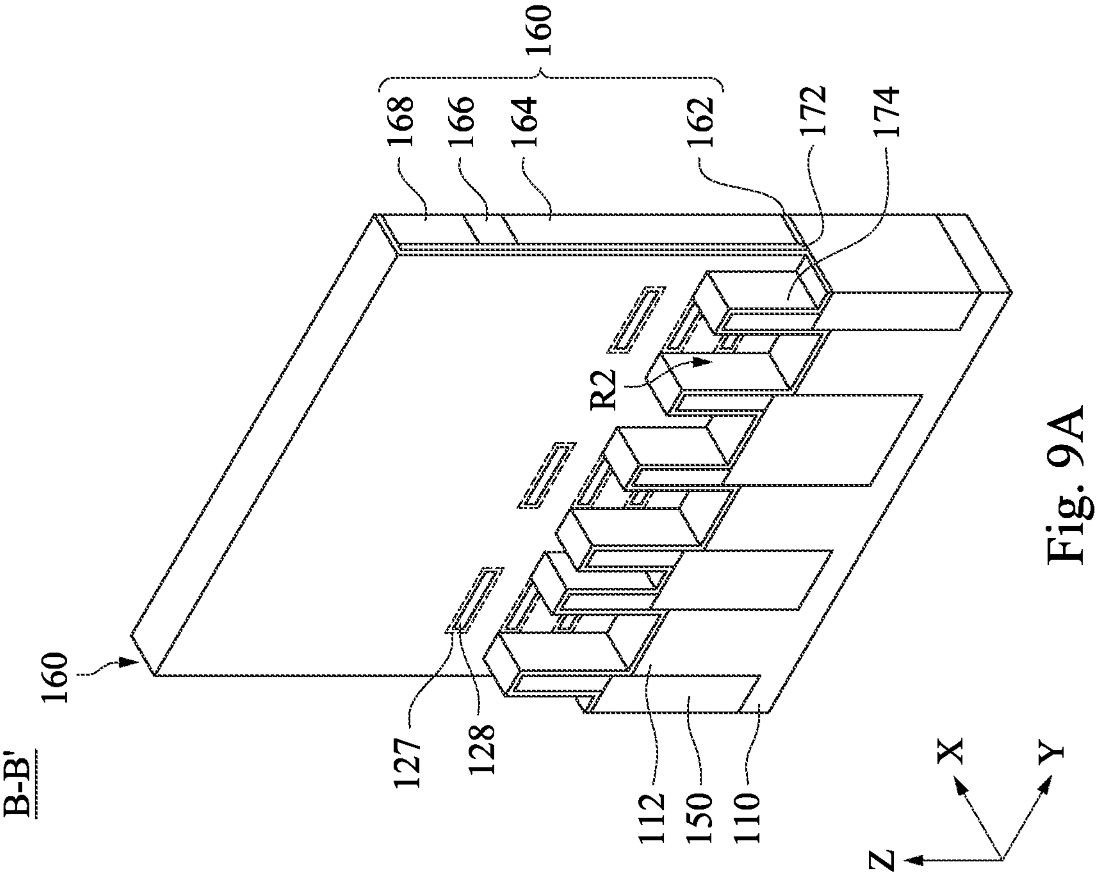

Reference is made to FIGS. 9A and 9B. Sacrificial materials 128 are formed over the spacer layer 127 and in the recess R2. On the other hand, the sacrificial materials 128 are formed over sidewalls of the remaining portions of the dielectric interposer 176. The sacrificial materials 128 will be subsequently replaced with air gaps, and the air gaps can serve as inner spacers acting as isolation features between the subsequently formed source/drain regions and the subsequently formed gate structures. As an example to form the sacrificial materials 128, the sacrificial materials 128 can then be formed by conformally forming a sacrificial material and subsequently etching the sacrificial material. The sacrificial material may be made of a material, such as silicon germanium (e.g., $Si_xGe_{1-x}$, where x can be in the range of 0 to 0.7), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. By way of example and not limitation, the sacrificial material 128 may include silicon germanium, and has a germanium atomic concentration greater than about 30%, such as about 30, 35, 40, 45, 50, 55, 60, 65, 70, 75, 80, 85, 90, or 95%.

The sacrificial materials 128 may be deposited by a conformal deposition process, such as ALD. CVD, or the like. The etching of the sacrificial materials 128 may be anisotropic. For example, the etching process may be a dry etch such as a RIE, a NBE, or the like. Although outer sidewalls of the sacrificial materials 128 are illustrated as being flush with respect to the sidewall of the spacer layer 127, the outer sidewalls of the sacrificial materials 128 may extend beyond or be recessed from the sidewall of the spacer layer 127. In other words, the sacrificial materials 128 may partially fill, completely fill, or overfill the sidewall recesses. Moreover, although the sidewalls of the sacrificial materials 128 are illustrated as being straight, the sidewalls of the sacrificial materials 128 may be concave or convex.

Figure 10B:
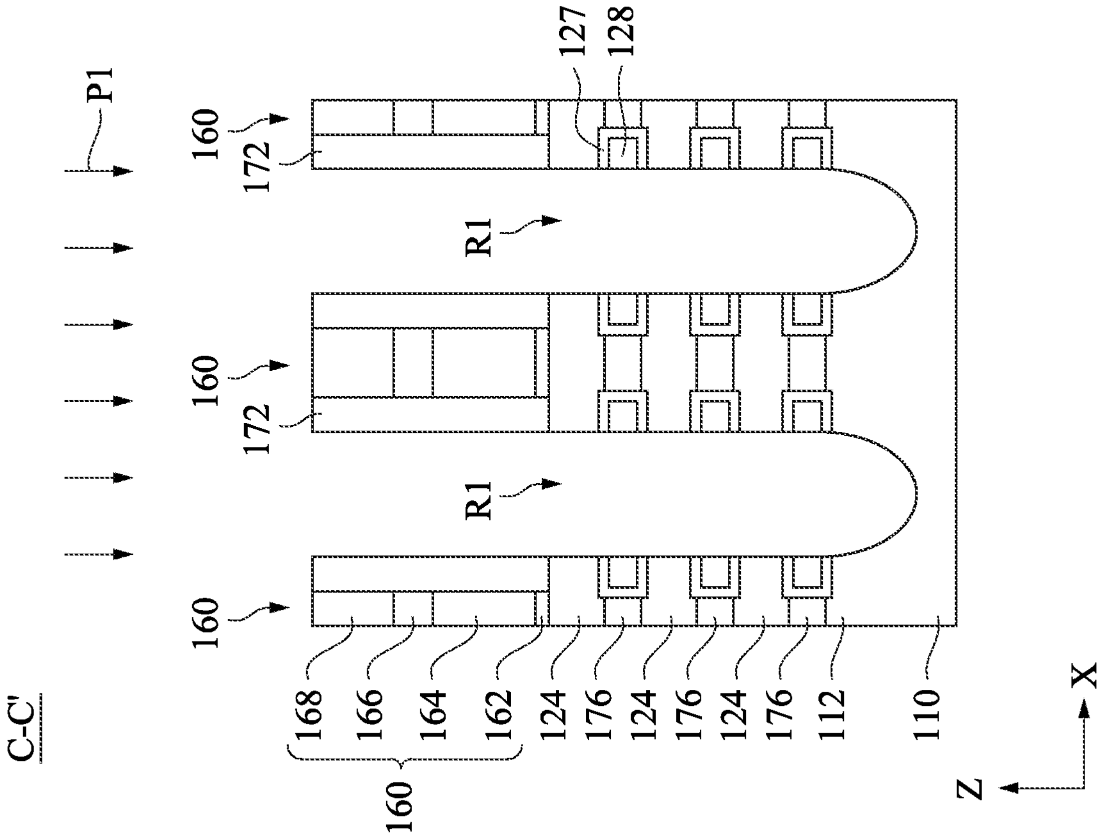
Figure 10A:
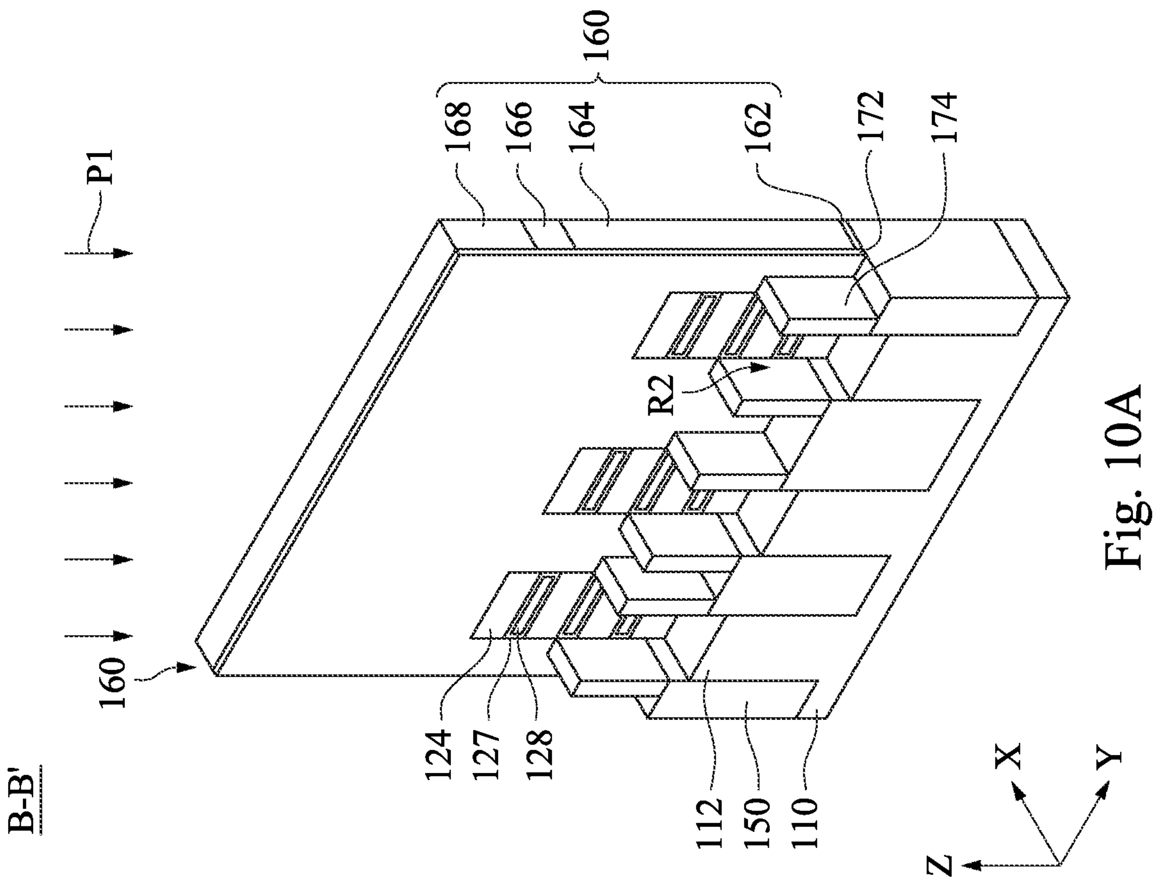

Reference is made to FIGS. 10A and 10B. A trim process P1 is performed to remove the spacer layer 127 outside of the recess R2. This operation may be performed by using a selective etching process, allowing for the selective etching of the semiconductor layers 122. In other words, the selective etching etches the spacer layer 127 at a faster etch rate than it etches the sacrificial materials 128 and the semiconductor layers 124, and thus the spacer layer 127 outside of the recess R2 can be completely removed. In some embodiments, the etching process would consume the portions of the sacrificial materials 128, and thus sacrificial materials 128 may be trimmed as shown in FIGS. 10A and 10B. Moreover, although the sidewalls of the sacrificial materials 128 are coterminous with the sidewall of the semiconductor layers 124 and are illustrated as being straight, the sidewalls of the sacrificial materials 128 may be concave or convex. In some embodiments, the etching process may be, for example, a dry etch, a chemical etch, or a wet cleaning process. For example, the chemical etch may employ fluorine-containing chemical such as dilute hydrofluoric (dHF) acid. As shown in FIG. 10A, the spacer layers 127 interleave with the semiconductor layers 122, and have ring-shaped profiles when viewed in a cross section taken along a lengthwise direction of the dummy gate structures 160.

Figure 11B:
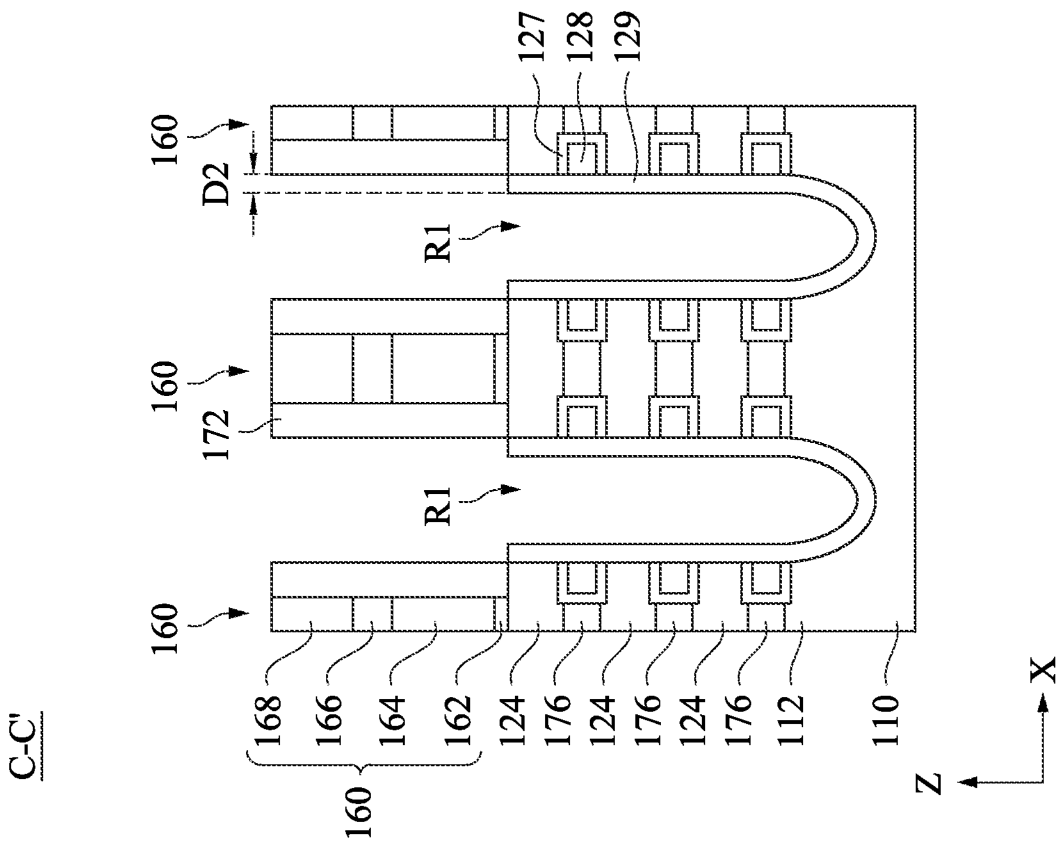
Figure 11A:
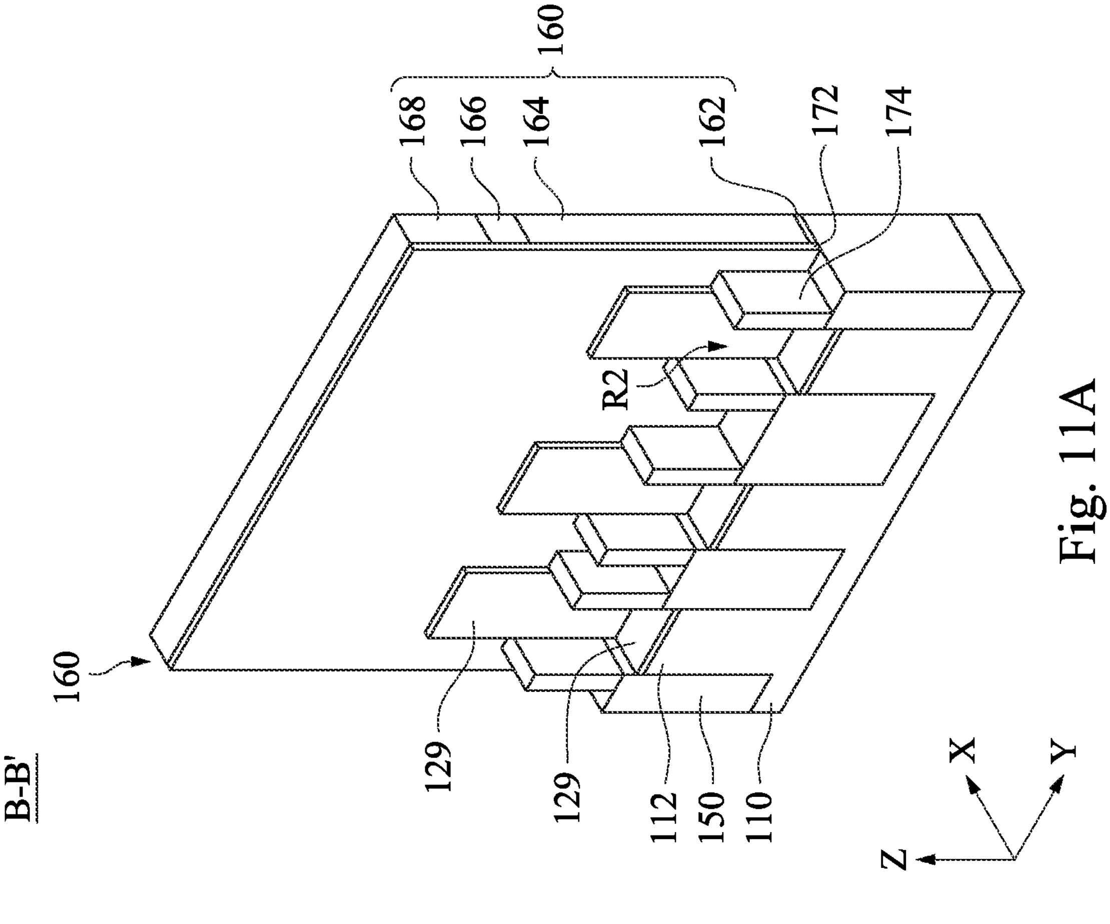

Reference is made to FIGS. 11A and 11B. Semiconductor material layers 129 are selectively grown on the protrusion structures 112, the semiconductor layers 124, the liner layers 127, and the sacrificial materials 128. The semiconductor material layer 129 can be deposited through an epitaxy process and may be performed using reduced pressure chemical vapor deposition (RPCVD), plasma enhanced chemical vapor deposition (PECVD), or the like. In some embodiments, the semiconductor material layer 129 may be formed of or comprises SiB. In some embodiments, the process gas for depositing the semiconductor material layer 129 may include a silicon-containing gas such as silane, disilane ($S_2H_6$), dicholorosilane ($H_2SiCl_2$, DCS), or the like, and a dopant-containing process gas such as a mixture gas including boron, or the like, depending on the desirable composition of semiconductor material layer 129. In some embodiments, the semiconductor material layer 129 may have a thickness D2 in a range from about 0.5 to 3 nm, such as about 0.5, 1, 1.5, 2, 2.5, or 3 nm. In some embodiments, the semiconductor material layer 129 can be interchangeably referred to a source/drain liner layer.

Figure 12B:
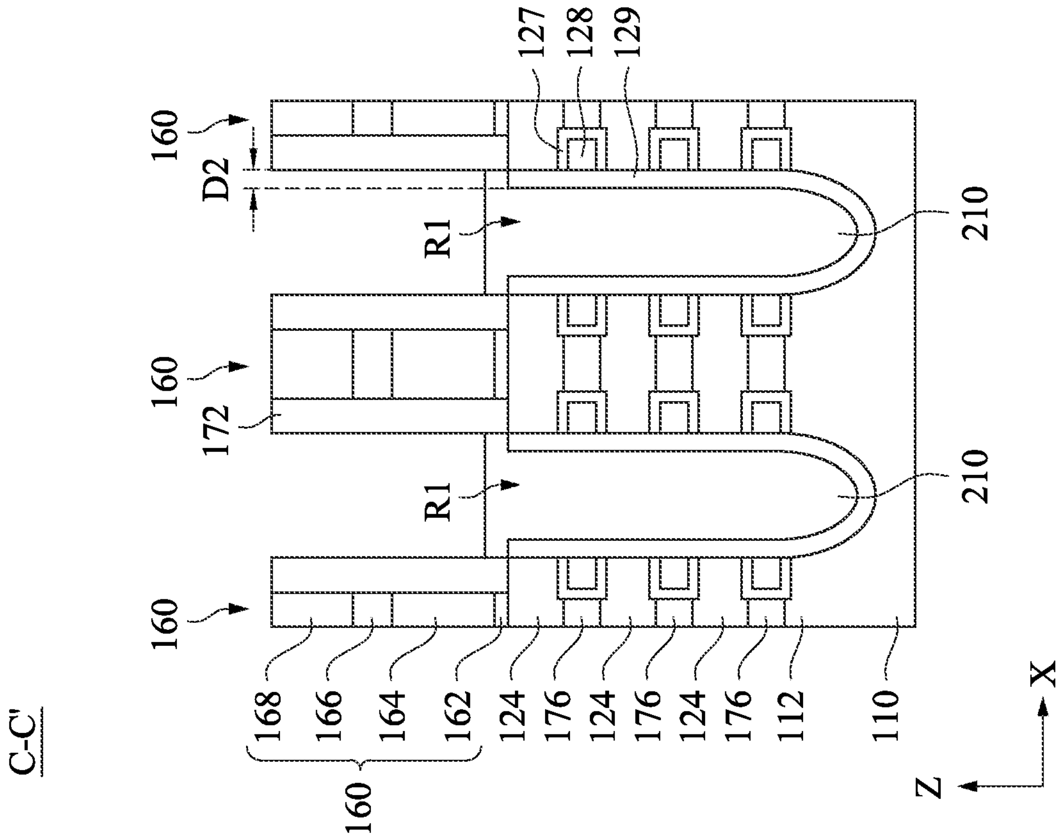
Figure 12A:
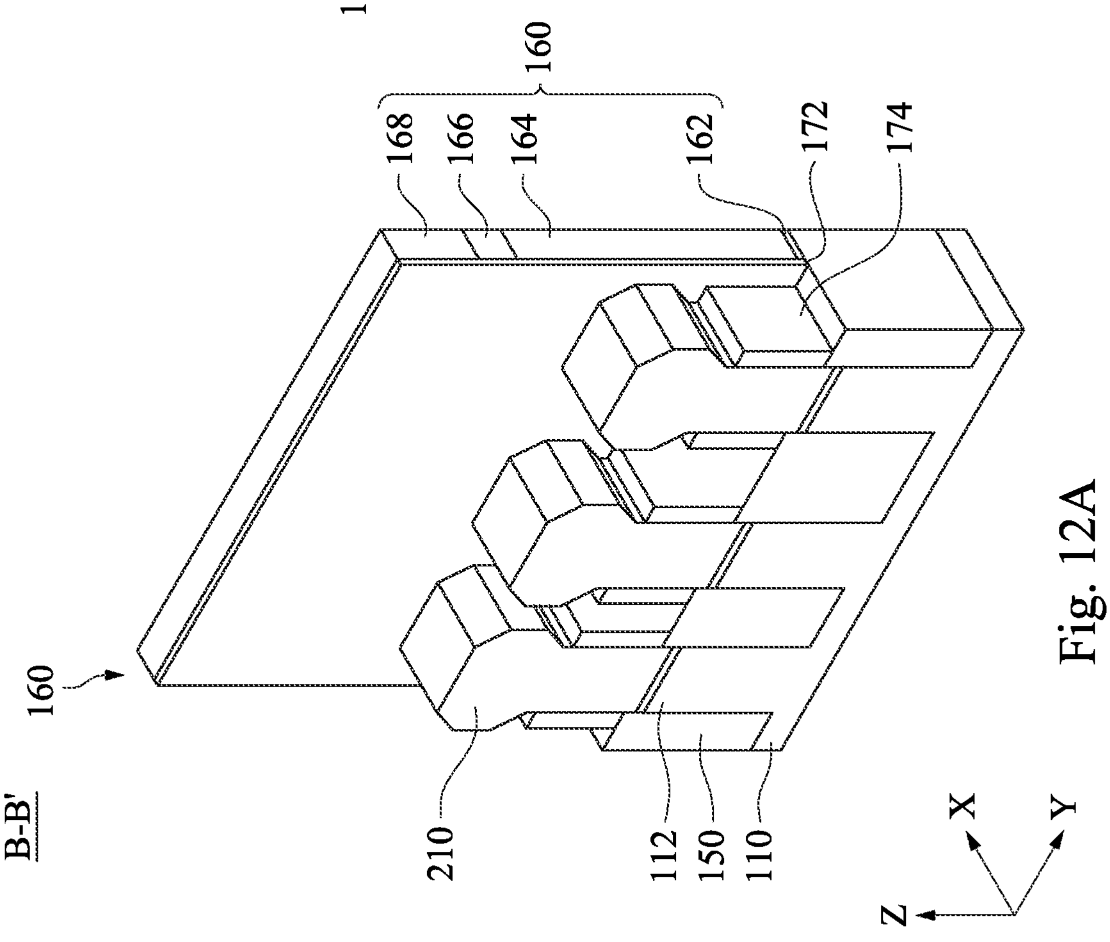
Figure 13B:
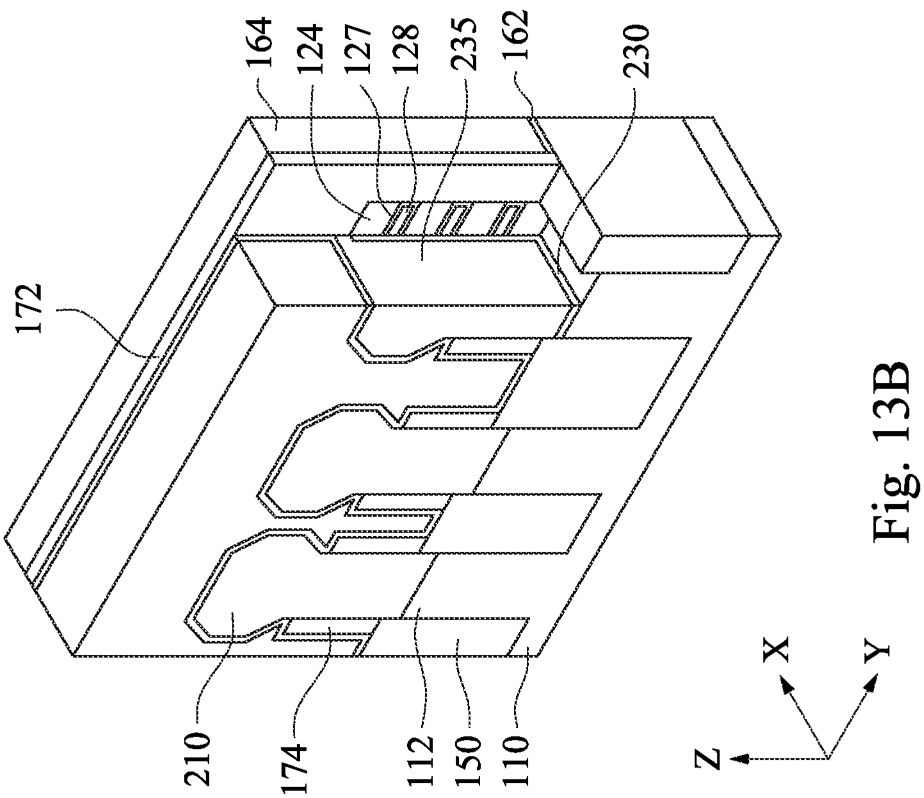
Figure 13A:
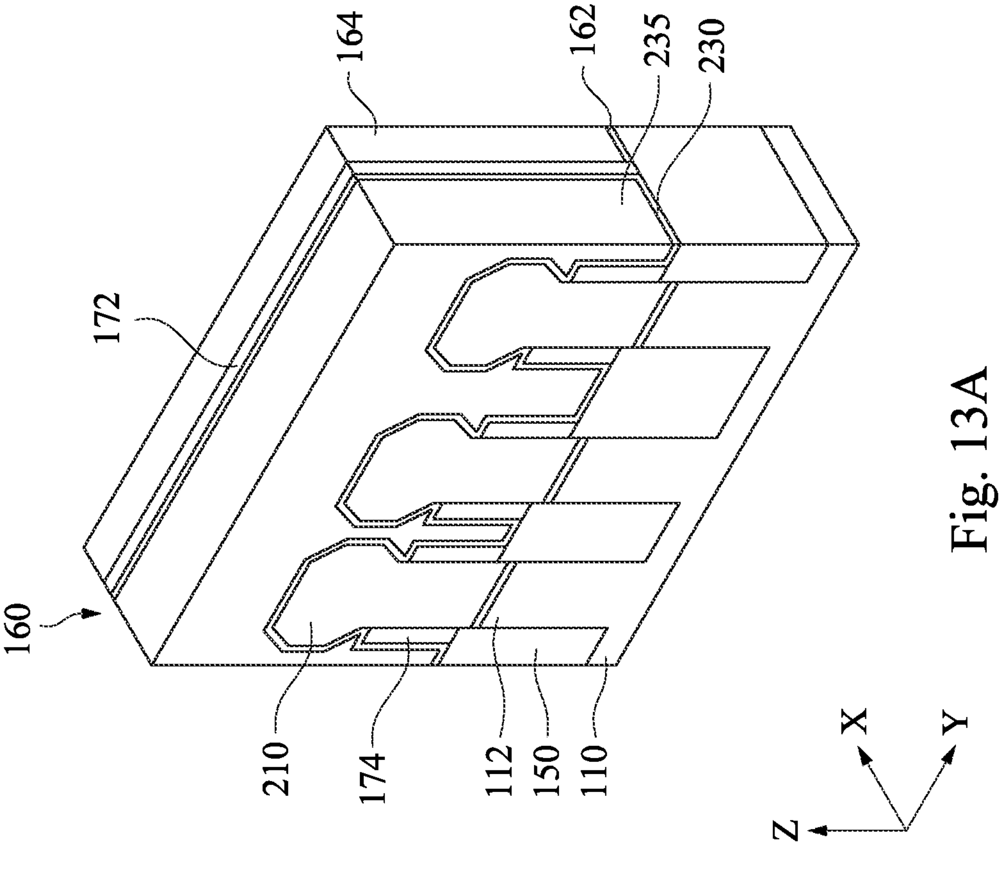
Figure 13C:
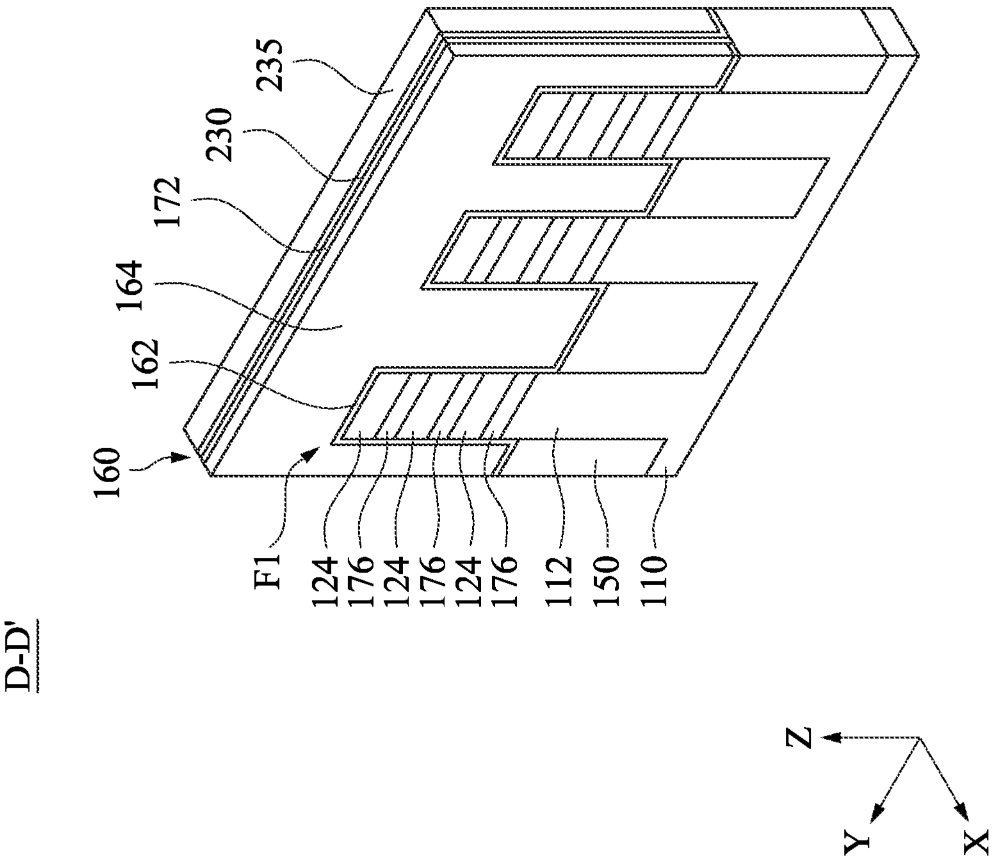
Figure 13E:
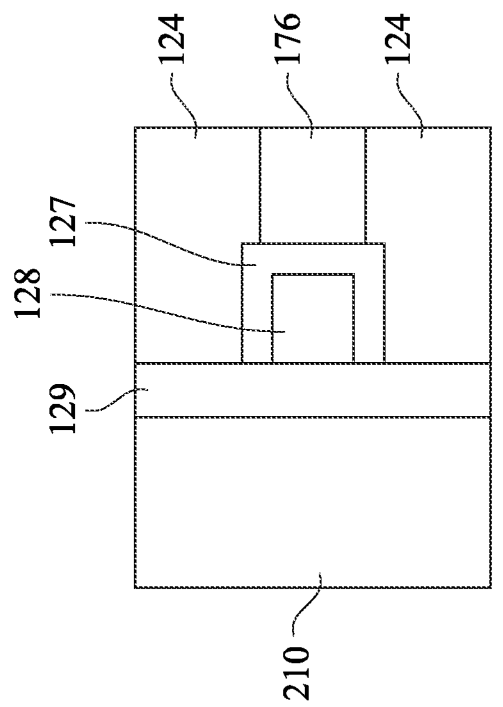
Figure 13D:
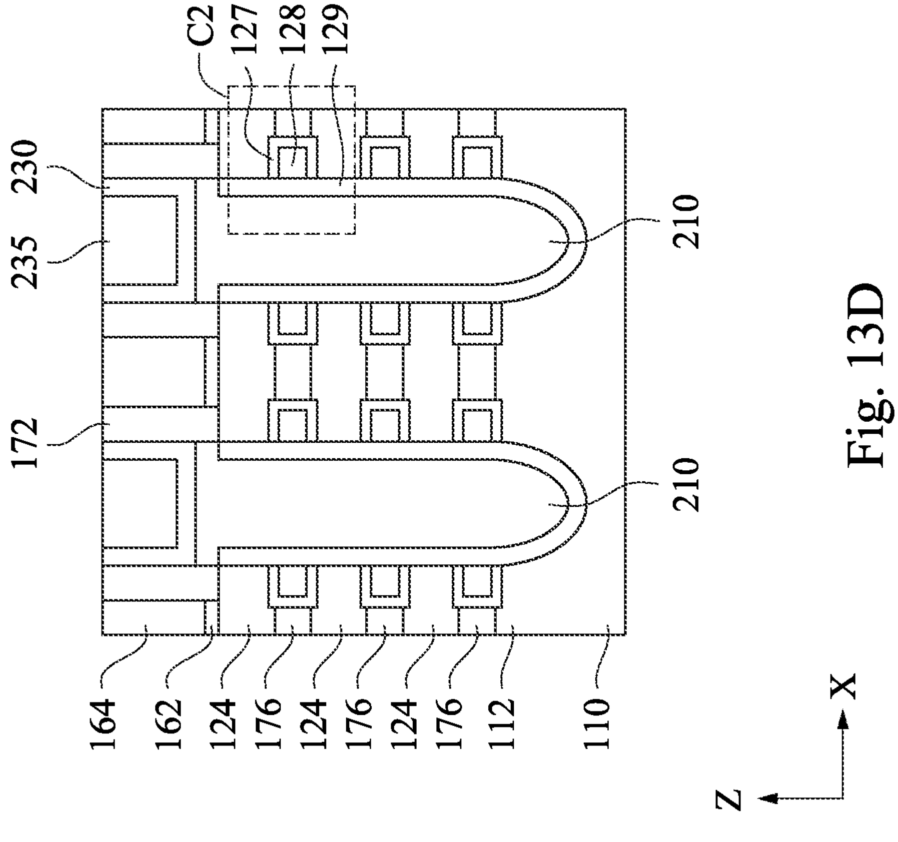
Figure 14B:
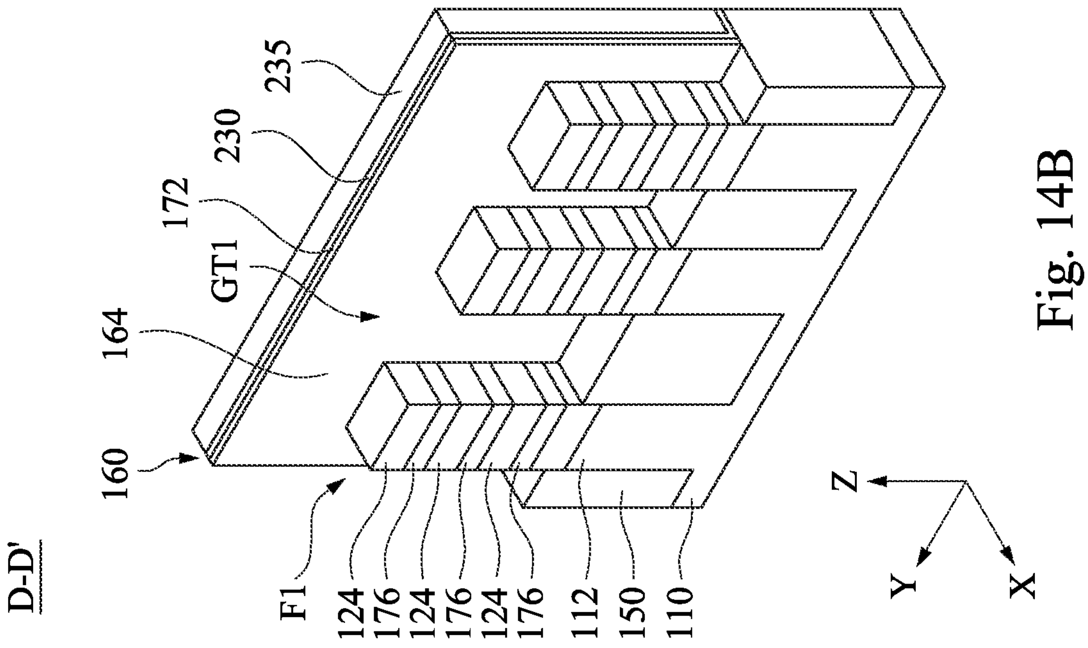
Figure 14A:
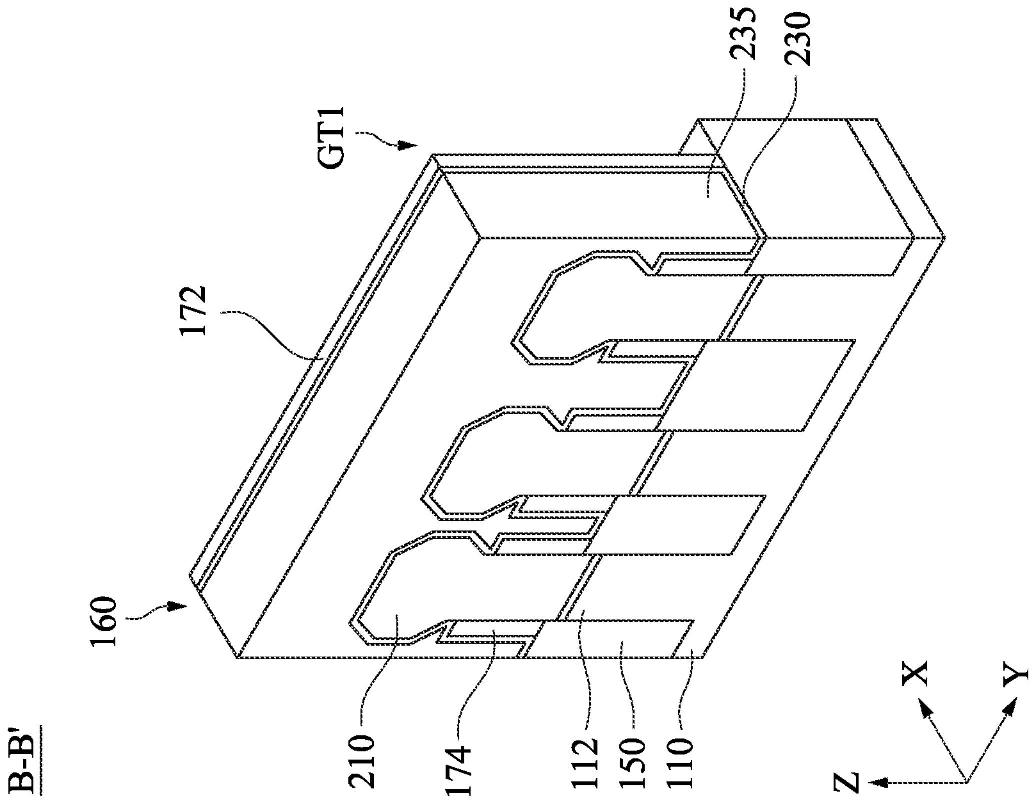
Figure 14C:
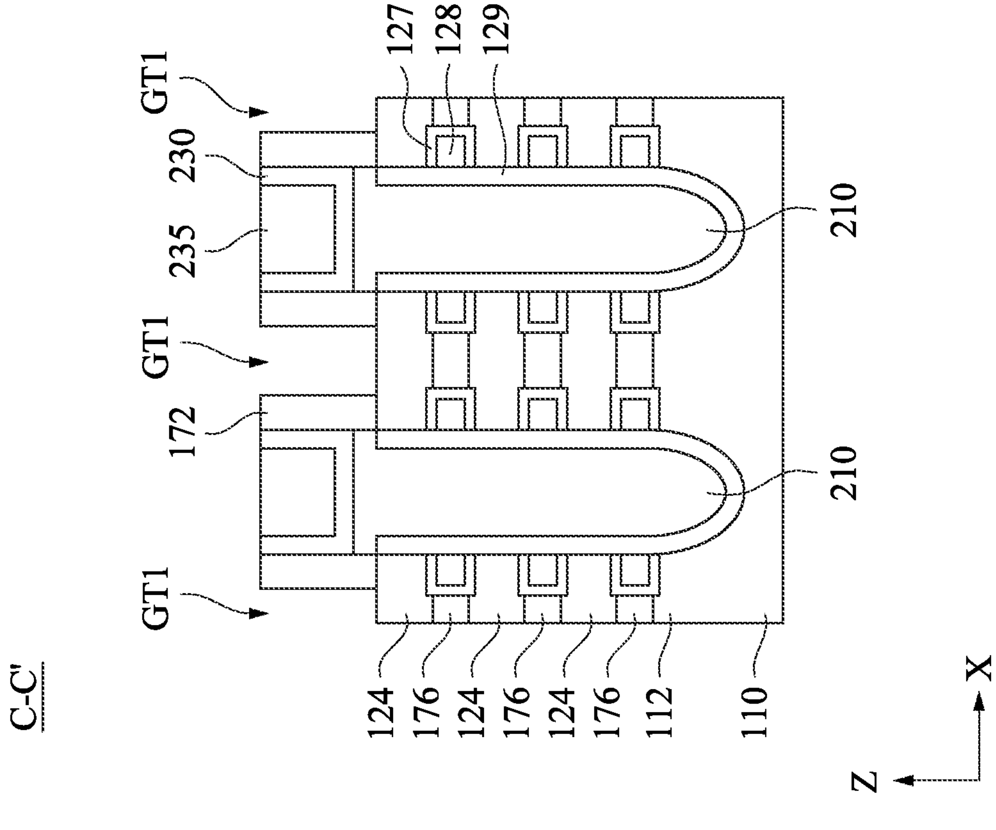
Figure 14D:
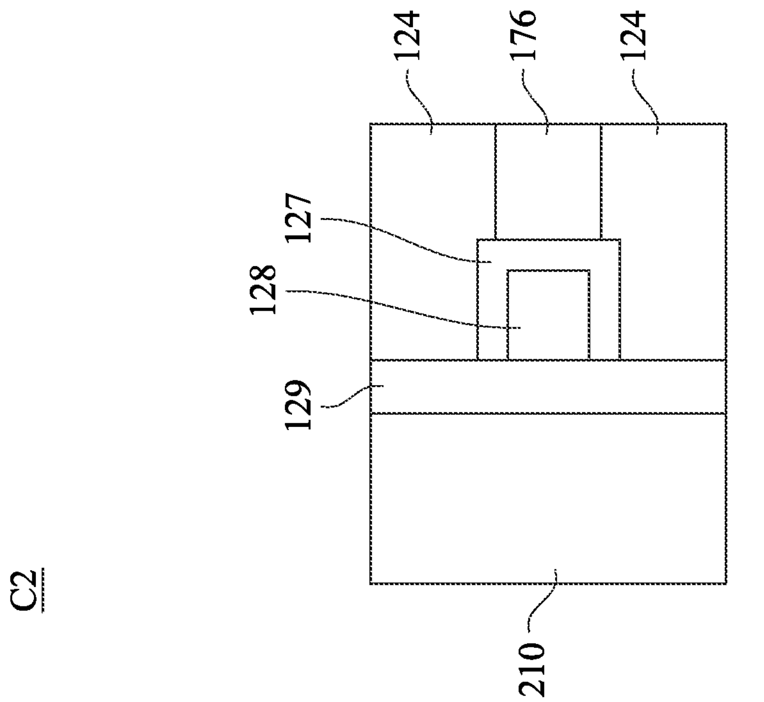
Figure 15A:
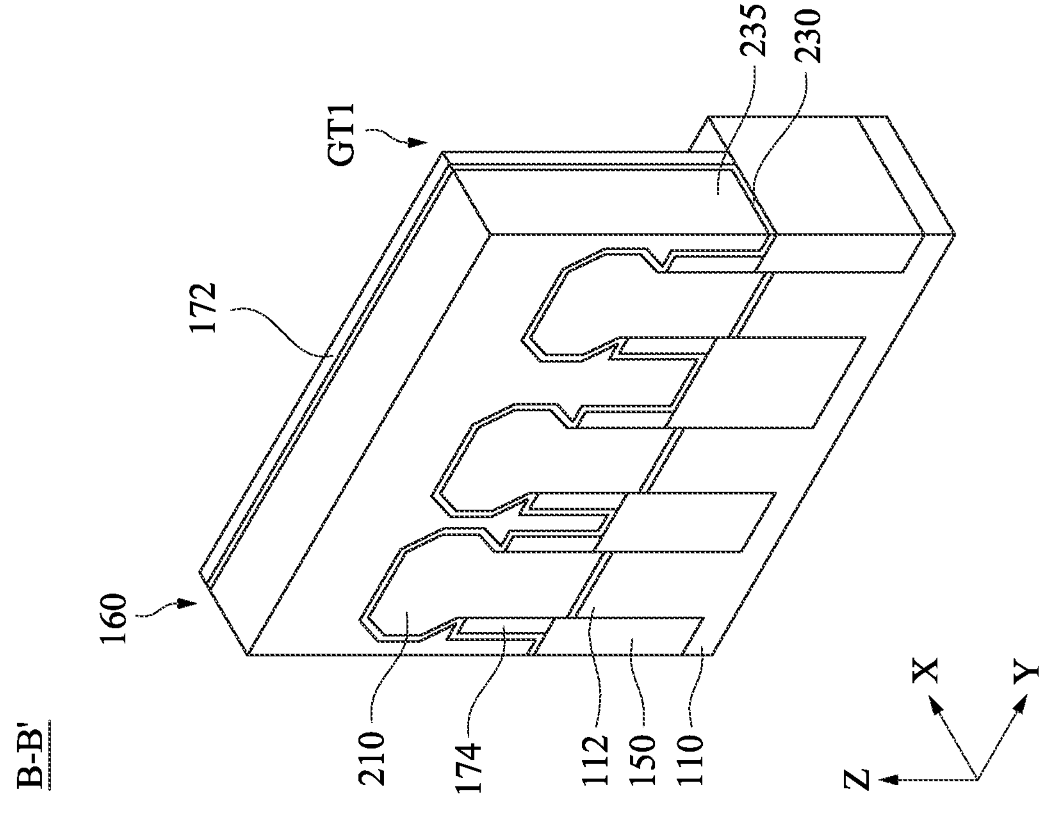
Figure 15B:
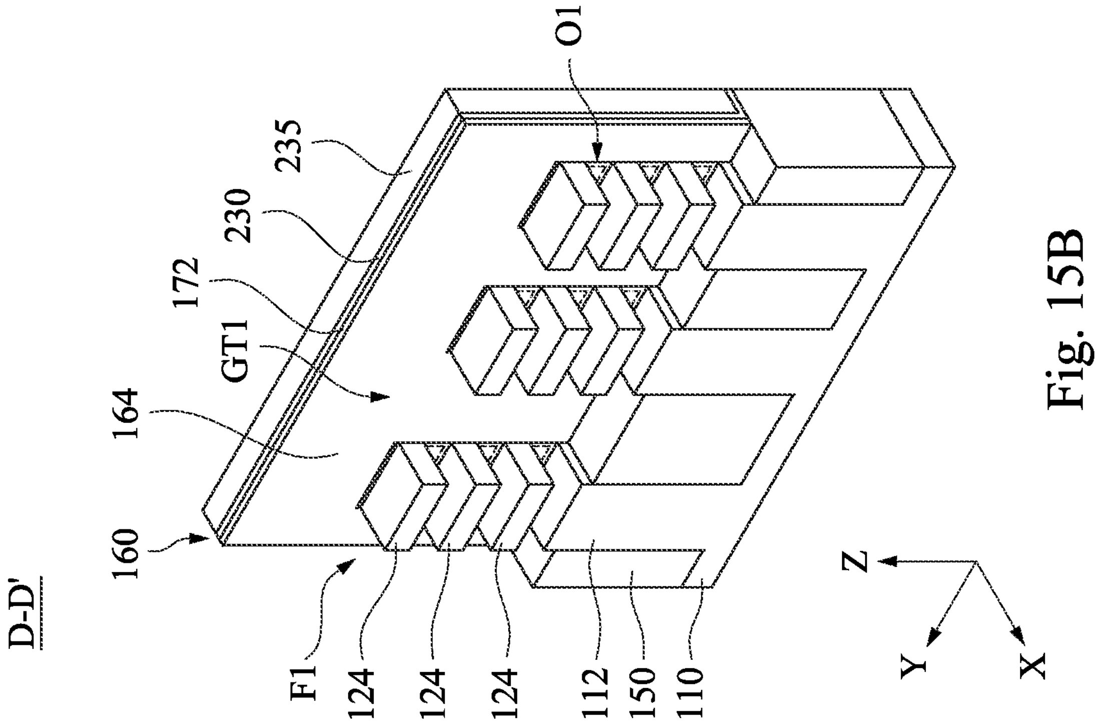
Figure 15D:
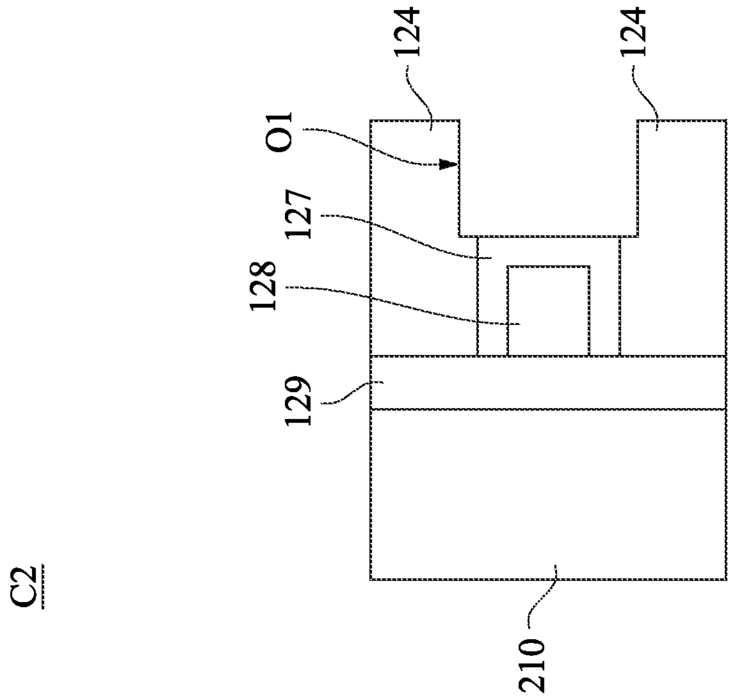
Figure 15C:
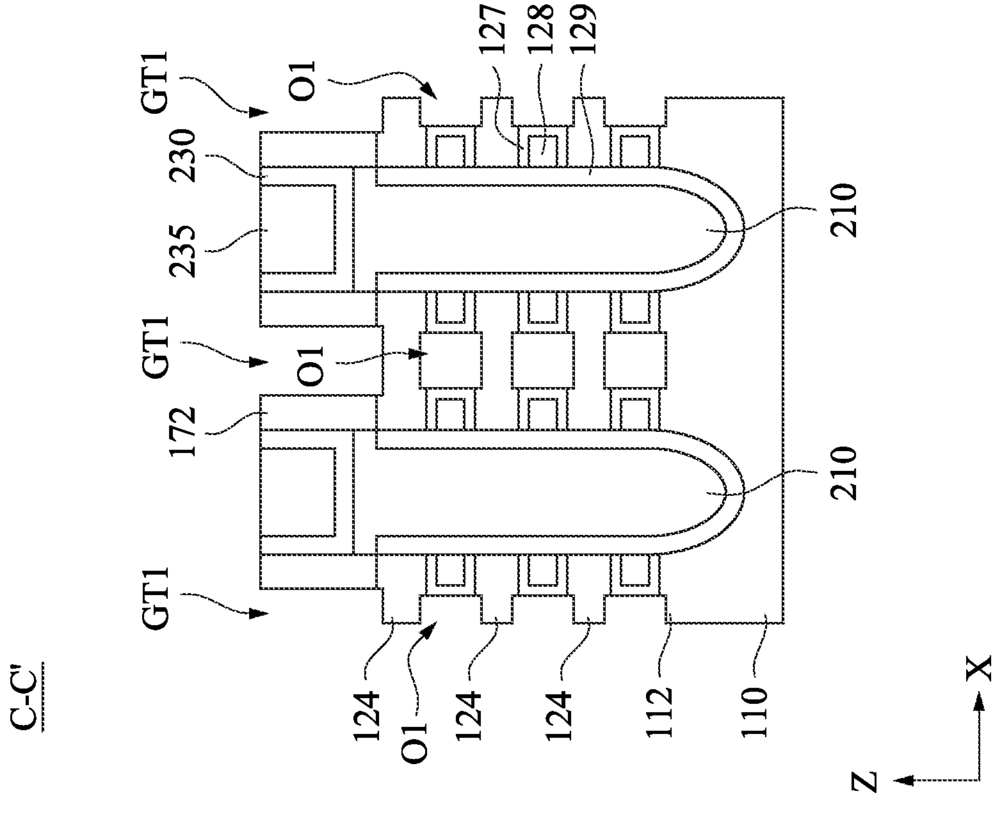
Figure 16B:
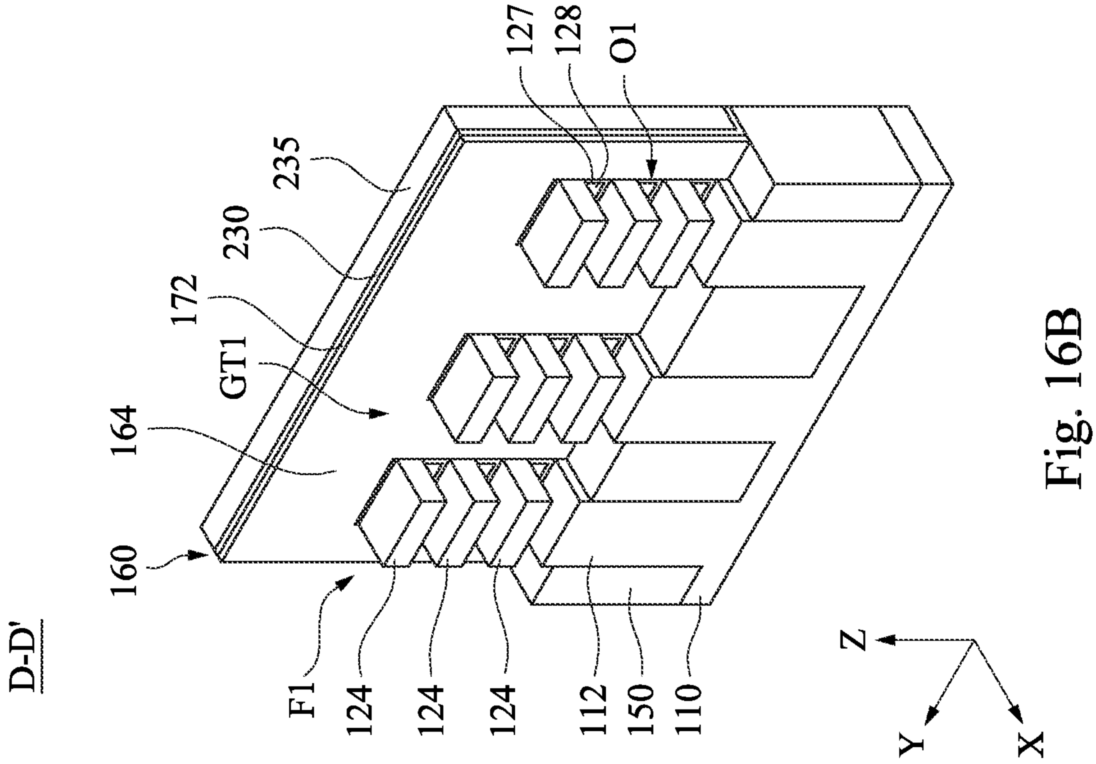
Figure 16A:
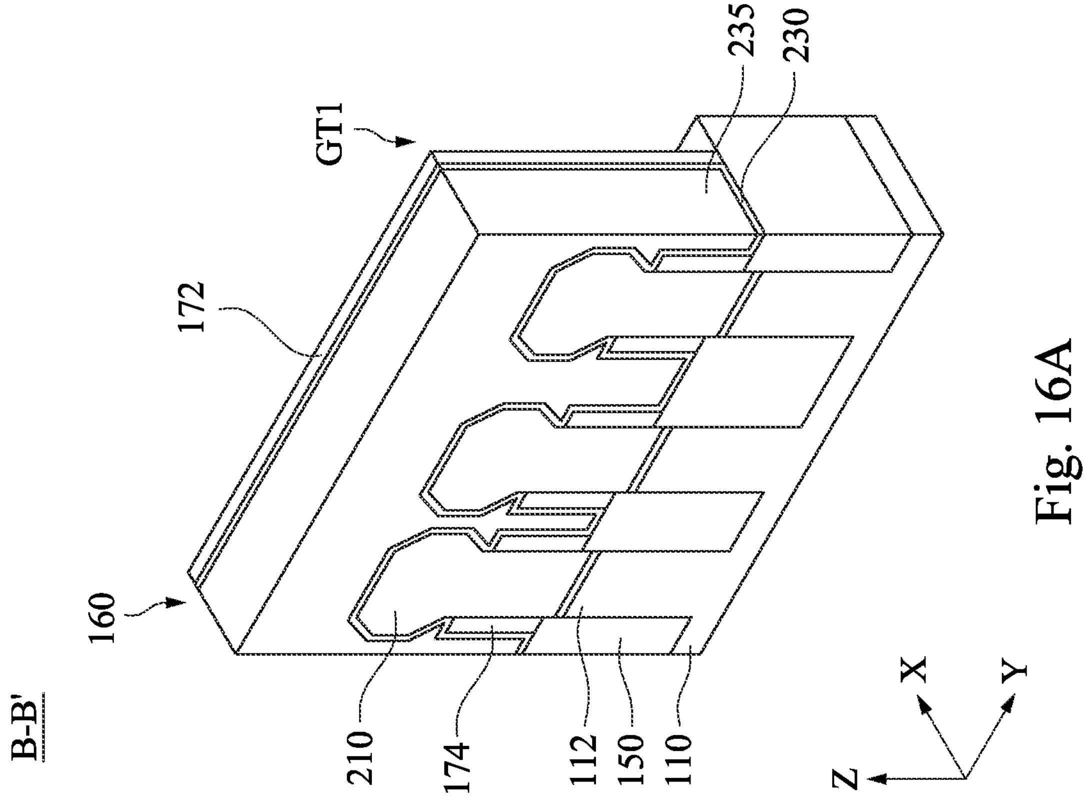
Figure 16D:
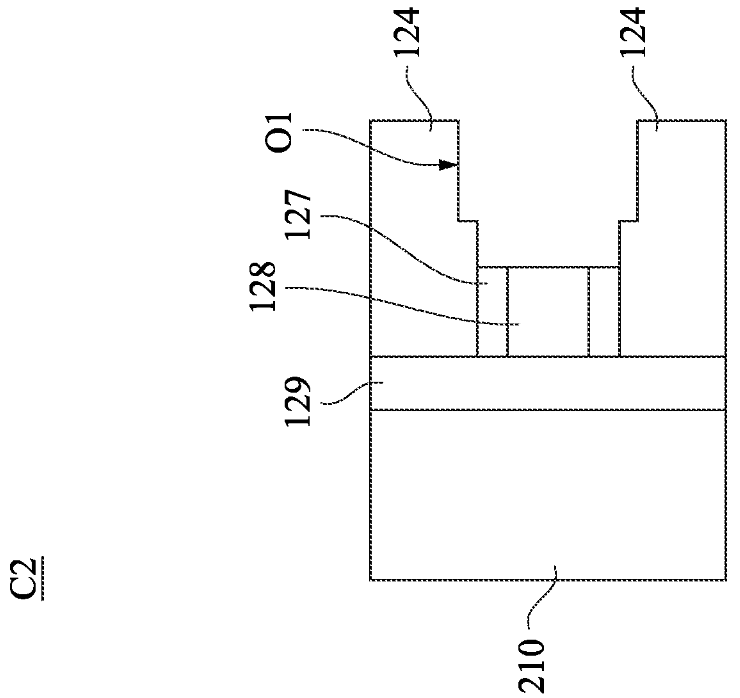
Figure 16C:
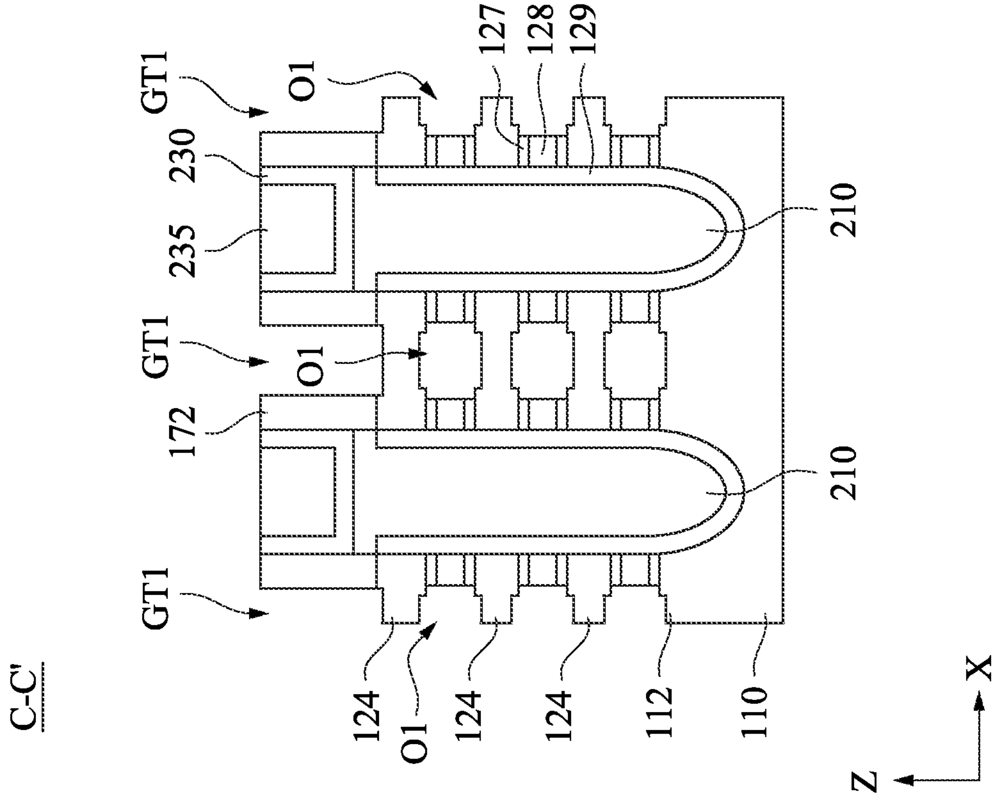
Figure 17B:
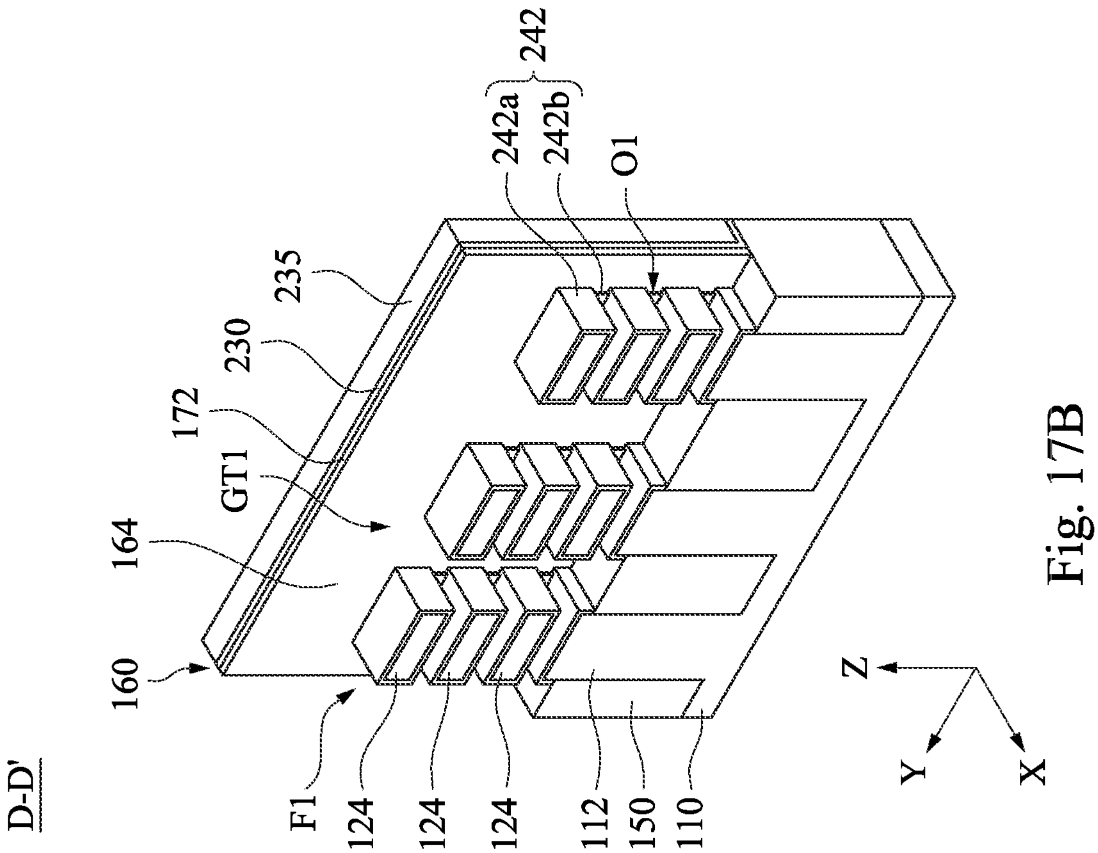
Figure 17A:
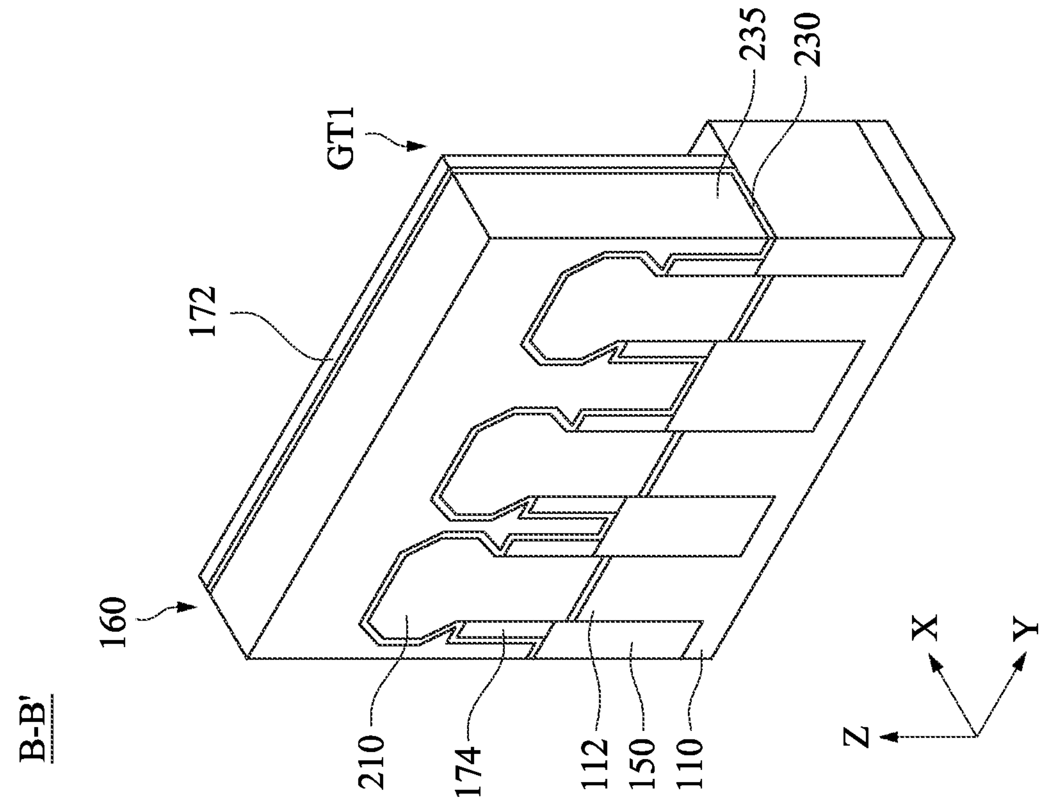
Figure 17D:
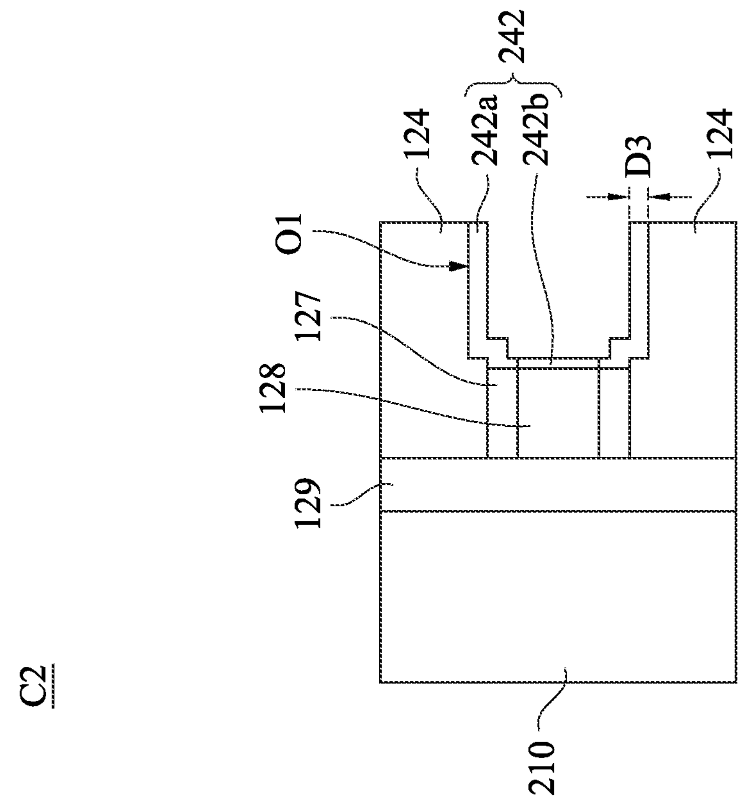
Figure 17C:
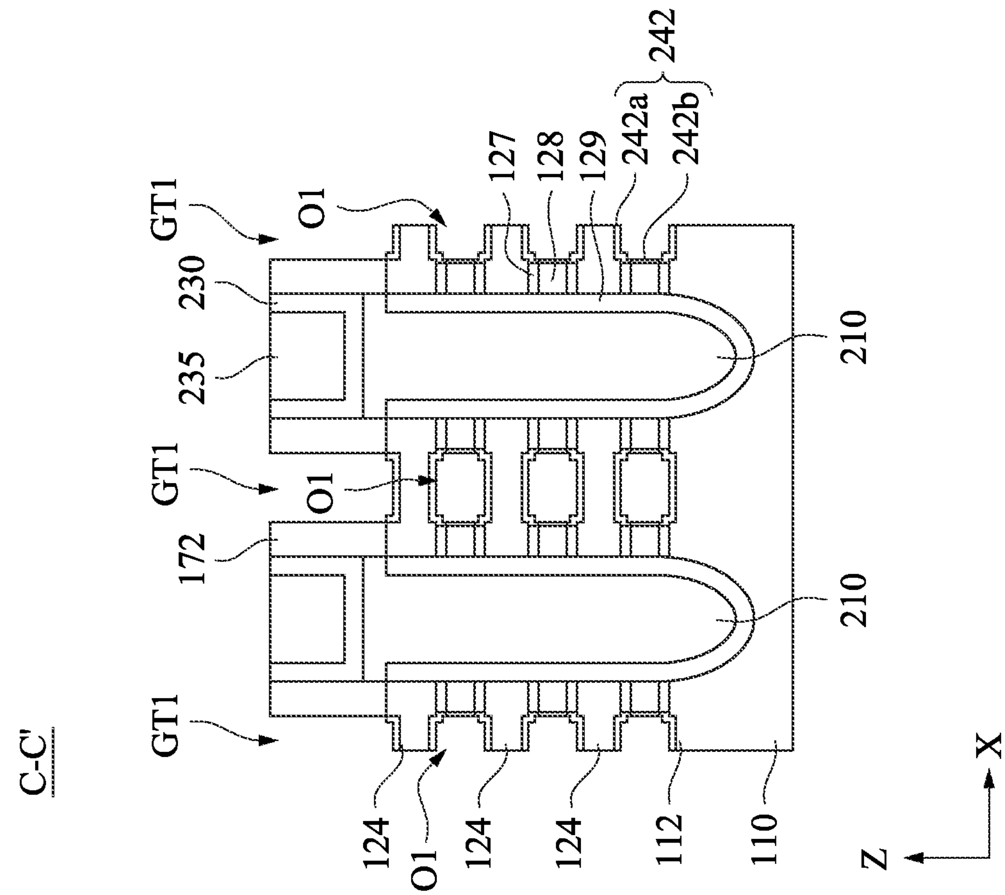
Figure 18B:
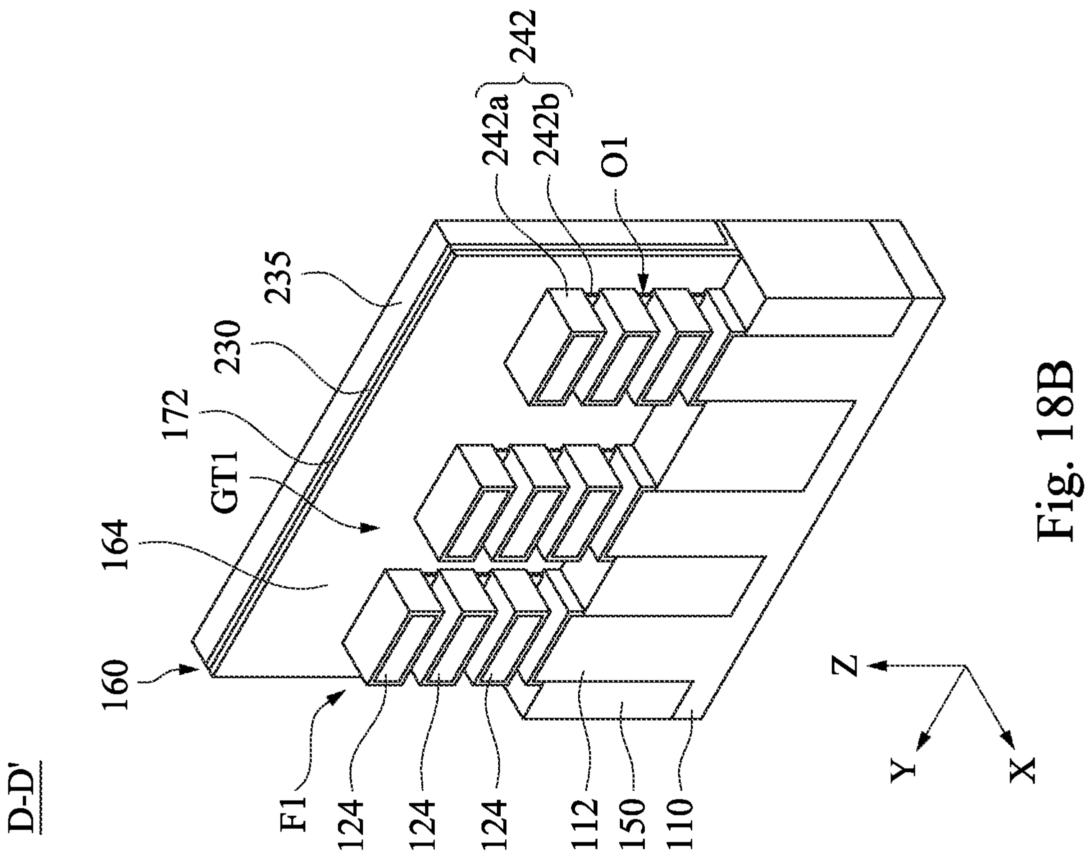
Figure 18A:
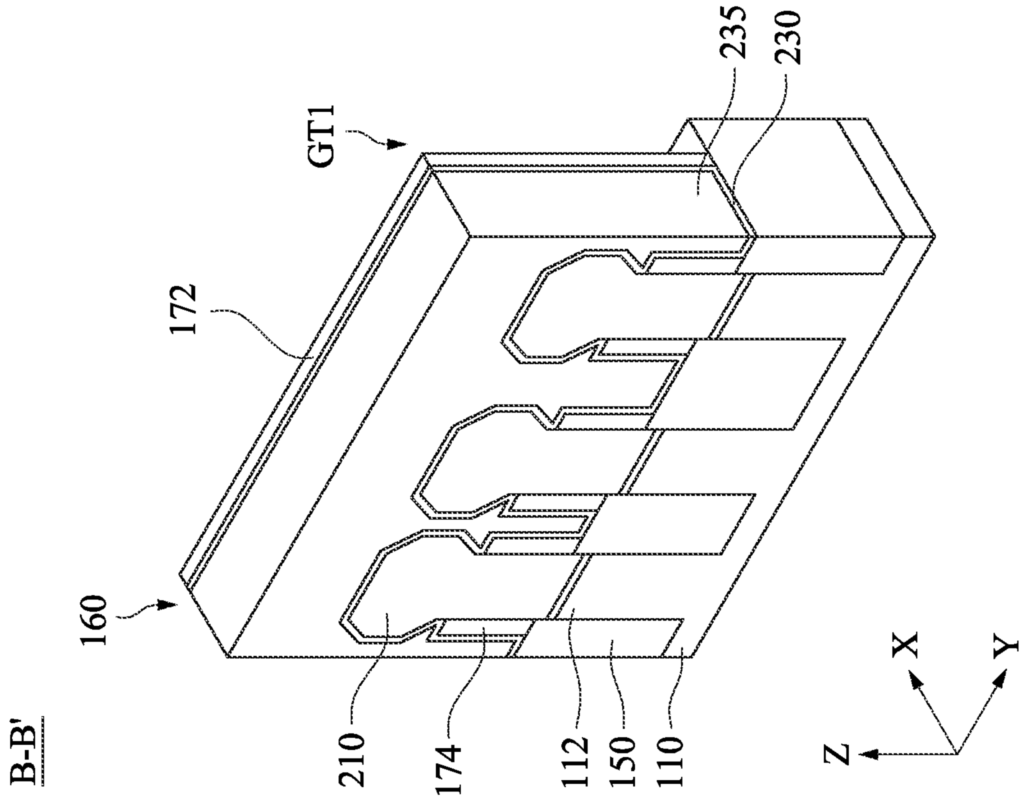
Figure 18D:
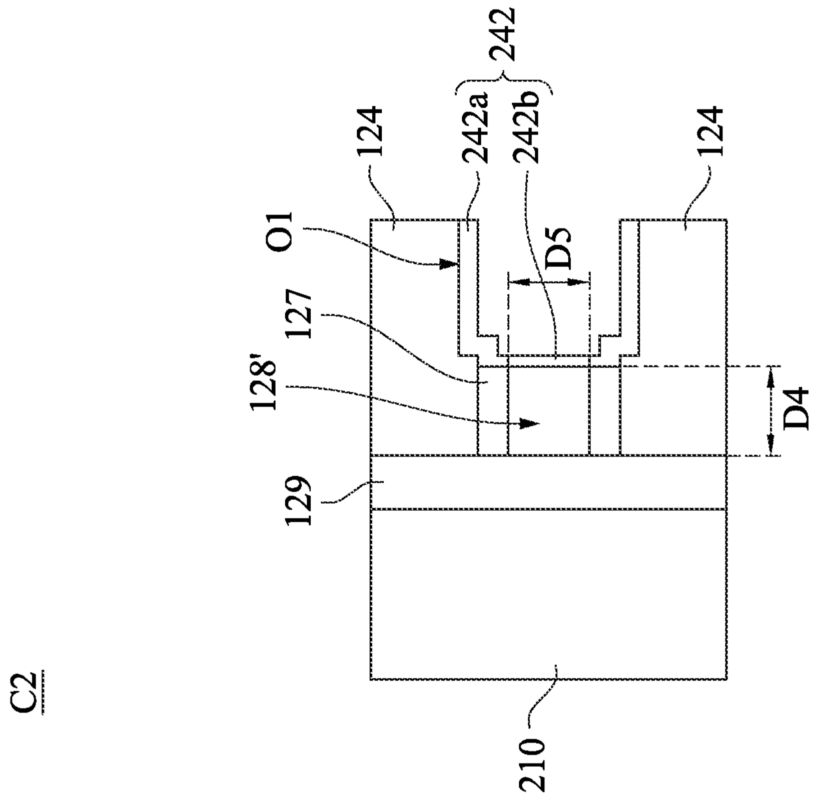
Figure 18C:
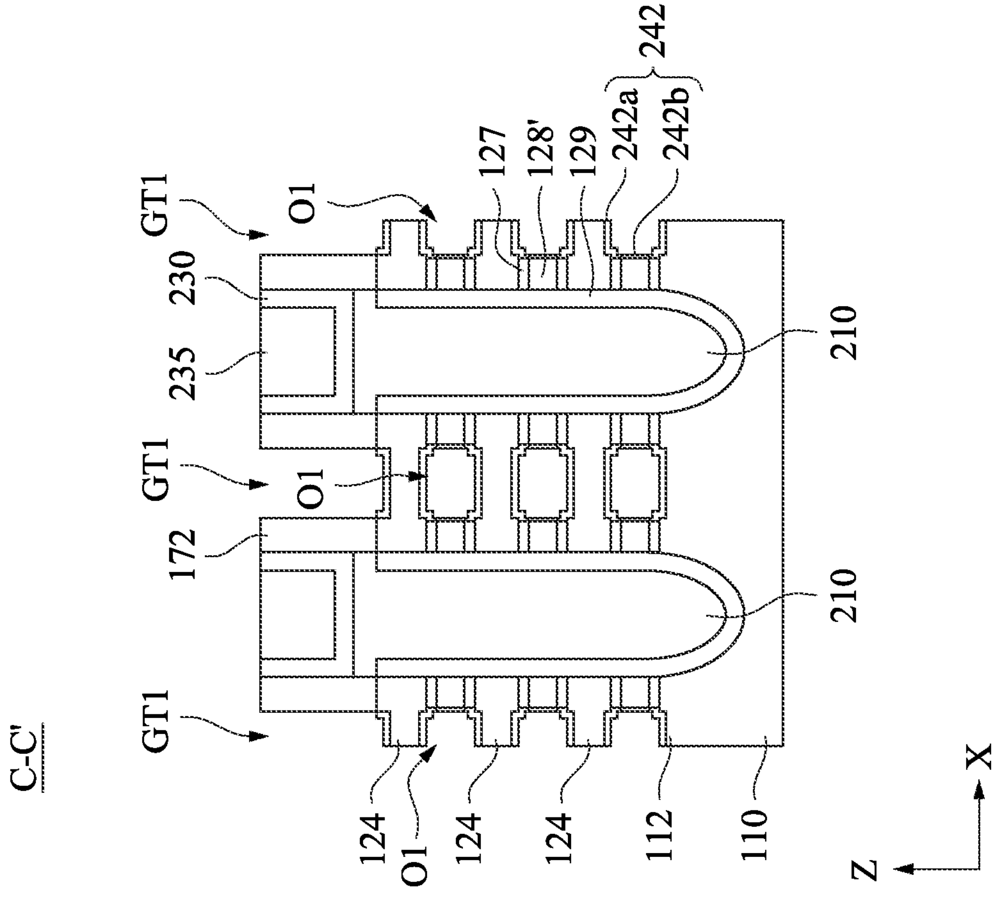

Reference is made to FIGS. 12A and 12B. Source/drain epitaxial structures 210 are formed at the source/drain regions of the fin structures F1. The source/drain epitaxial structures 210 are formed over the semiconductor material layer 129 and connected to the semiconductor layers 124. The source/drain epitaxial structures 210 may be formed by performing an epitaxial growth process that provides an epitaxial material connected to the fin structures F1. During the epitaxial growth process, the dummy gate structures 160, the gate spacers 172, the sidewall spacers 174 limit the source/drain epitaxial structures 210 to the source/drain regions. In some embodiments, the lattice constants of the source/drain epitaxial structures 210 are different from the lattice constant of the semiconductor layers 124, so that the semiconductor layers 124 can be strained or stressed by the source/drain epitaxial structures 210 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor layers 124.

In some embodiments, the source/drain epitaxial structures 210 may include Ge, Si, GaAs, AlGaAs, SiGe, GaAsP, SiP, or other suitable material. The source/drain epitaxial structures 210 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 210 are not in-situ doped, an implantation process (i.e., a junction implant process) is performed to dope the source/drain epitaxial structures 210. In some embodiments, the source/drain epitaxial structures 210 can be interchangeably referred to as source/drain regions, source/drain patterns, or source/drain structures.

Reference is made to FIGS. 13A-13E. A contact etch stop layer (CESL) 230 is conformally formed over the substrate 110. In some embodiments, the CESL 230 can be a stressed layer or layers. In some embodiments, the CESL 230 has a tensile stress and is formed of SiN, SiCN, combinations thereof, of the like. In some other embodiments, the CESL 230 includes materials such as oxynitrides. In yet some other embodiments, the CESL 230 may have a composite structure including a plurality of layers, such as a silicon nitride layer overlying a silicon oxide layer. The CESL 230 can be formed using plasma enhanced CVD (PECVD), however, other suitable methods, such as low-pressure CVD (LPCVD), atomic layer deposition (ALD), and the like, can also be used.

Subsequently, an interlayer dielectric (ILD) layer 235 is then formed on the CESL 230. The ILD layer 235 may be formed by chemical vapor deposition (CVD), high-density plasma CVD, spin-on, sputtering, or other suitable methods. In some embodiments, the ILD layer 235 includes silicon oxide. In some other embodiments, the ILD layer 235 may include silicon oxy-nitride, silicon nitride, SiOCN, compounds including Si, O, C and/or H (e.g., silicon oxide, SiCOH and SiOC), a low-k material, or organic materials (e.g., polymers). After the ILD layer 235 is formed, a planarization operation, such as CMP, is performed, so that the dielectric layers 166 and 168 (see FIGS. 12A and 12B) are removed and the dummy gate electrode layers 164 are exposed.

Reference is made to FIGS. 14A-14D. The dummy gate electrode layers 164 and the dummy gate dielectric layers 162 of the dummy gate structures 160 (see FIGS. 13A-13C) are then removed, thereby exposing the semiconductor layers 124 and the dielectric interposers 176. The ILD layer 235 protects the source/drain epitaxial structures 210 during the removal of the dummy gate electrode layers 164 and the dummy gate dielectric layers 162. In some embodiments, the dummy gate electrode layers 164 and the dummy gate dielectric layers 162 are removed by using a selective etching process (e.g., selective dry etching, selective wet etching, or combinations thereof) that etches the materials in dummy gate electrode layers 164 and the dummy gate dielectric layers 162 at a faster etch rate than it etches other materials (e.g., the gate spacers 172 and/or the ILD layer 235), thus resulting in gate trenches GT1 between corresponding gate spacers 172, with the semiconductor layers 124 and the dielectric interposers 176 exposed in the gate trenches GT1.

Reference is made to FIGS. 15A-15D. The dielectric interposers 176 in the gate trenches GT1 are removed by using another selective etching process that etches the dielectric interposers 176 at a faster etch rate than it etches the semiconductor layers 124, thus forming openings O1 between neighboring semiconductor layers (i.e., channel layers) 124. In this way, the semiconductor layers 124 become nanosheets suspended over the substrate 110 and between the source/drain epitaxial structures 210. This operation is also called a channel release process. In some embodiments, the etching process would consume the portions of the semiconductor layers 124, and thus semiconductor layers 124 may be trimmed to have a thinner thickness than those shown in FIG. 14C. In some embodiments, the semiconductor layers 124 can be interchangeably referred to as nanostructure (fork-sheets, nanowires, nanoslabs and nanorings, nanosheet, etc., depending on their geometry). For example, in some other embodiments the semiconductor layers 124 may be trimmed to have a substantial rounded shape (i.e., cylindrical) due to the selective etching process for completely removing the dielectric interposers 176.

Reference is made to FIGS. 16A-16D. A trim process is performed to remove the spacer layer 127 exposed from the opening O1. Specifically, the exposed spacer layer 127 in the gate trenches GT1 can be removed by using another selective etching process that etches the spacer layer 127 at a faster etch rate than it etches the semiconductor layers 124 to expose the sacrificial materials 128. In some embodiments, the etching process may be, for example, a dry etch, a chemical etch, or a wet cleaning process. For example, the chemical etch may employ fluorine-containing chemical such as dilute hydrofluoric (dHF) acid.

Reference is made to FIGS. 17A-17D. An interfacial layer 242 is formed in the gate trenches GT1 and the openings O1. Specifically, the interfacial layer 242 has a first portion 242*a* formed to about the semiconductor layers 124 and the protrusion structures 112, and a second portion 242*b* formed on the spacer layer 127 and the exposed sacrificial materials 128. In some embodiments, the interfacial layer 242 may include a dielectric material such as silicon oxide ($SiO_2$), HfSiO, or silicon oxynitride (SiON). The interfacial layer 242 may be formed by chemical oxidation, thermal oxidation, atomic layer deposition (ALD), chemical vapor deposition (CVD), and/or other suitable method. In some embodiments, the interfacial layer 242 can be interchangeably referred to an oxide layer.

By way of example and not limitation, the chemical oxidation process can be performed to form an oxide layer (e.g., the interfacial layer 242) on the surface of a semiconductor material (e.g., the sacrificial material 128 and the semiconductor layer 124) by reacting it with an oxidizing agent. The semiconductor for this process may include silicon (Si), which forms silicon oxide ($SiO_2$) upon oxidation. The formed oxide layer, in this context can be referred to as the interfacial layer 242. In some embodiments, before the chemical oxidation process, a cleaning process, such as the RCA clean, can be used to remove organic residues and metal ions, so as to ensure the sacrificial material 128 and the semiconductor layer 124 can be free of contaminants. Subsequently, oxidizing agents like hydrogen peroxide ($H_2O_2$), ozone ($O_3$), or a combination of them can be used. In some embodiments, the substrate 110 can be immersed in a solution containing the chosen oxidizing agent. The reaction between the semiconductor material and the oxidizing agent leads to the growth of the oxide layer (e.g., the interfacial layer 242) on the surfaces of the sacrificial material 128 and the semiconductor layer 124. In some embodiments, after the chemical oxidation process, the substrate 110 can be annealed in an inert atmosphere (like nitrogen or argon) or forming gas (a mixture of hydrogen and nitrogen). Annealing helps improve the oxide's quality by repairing defects and reducing charge traps. Subsequently, the substrate 110 can be allowed to cool down to room temperature at a controlled rate to prevent the introduction of thermal stresses in the oxide layer.

By way of example and not limitation, the semiconductor layers 124 may be made of silicon (Si), and the sacrificial materials 128 may be made of silicon germanium (SiGe). When subjected to, such as a chemical oxidation process, both these materials may undergo an oxidative transformation, producing oxides (e.g., first and second portions 242*a* and 242*b* of the interfacial layer 242) on their surfaces. In greater detail, when silicon from the semiconductor layers 124 is exposed to an oxidizing agent in the chemical oxidation process, it reacts with the oxidizing agent to form silicon oxide ($SiO_2$) layer (e.g., first portion 242*a* of the interfacial layer 242), this silicon dioxide layer may act as an insulating layer (e.g., gate oxide) in a transistor. On the other hand, when silicon germanium is exposed to an oxidizing agent in the chemical oxidation process, both silicon and germanium will react with the oxidizing agents. The silicon in silicon germanium forms silicon oxide ($SiO_2$). Concurrently, the germanium in the silicon germanium forms germanium oxide ($GeO_2$). Thus, the oxide layer (i.e., second portion 242*b* of the interfacial layer 242) formed on the sacrificial materials 128 is a composite layer consisting of both silicon oxide and germanium oxide.

In some embodiments, the chemical oxidation process can involve the use of water or water vapor. While silicon oxide is stable and insoluble in water, germanium oxide exhibits a contrasting behavior (i.e., soluble in water). As the sacrificial materials 128 undergo the chemical oxidation in the presence of water, the formed germanium oxide in the second portion 242*b* of the interfacial layer 242 can dissolve away. As the germanium oxide is leached out, it leaves behind voids or pores on the second portion 242*b* of the interfacial layer 242, and it results in a porous oxide structure. In some embodiments, the second portion 242*b* of the interfacial layer 242 is more porous than the first portion 242*a* of the interfacial layer 242. In some embodiments, the first portion 242*a* of the interfacial layer 242 is porous-free. In some embodiments, the interfacial layer 242 may have a thickness D3 (see FIG. 17D) in a range from about 0.5 to 2 nm, such as about 0.5, 1, 1.5, or 2 nm. The spacer layer 127 can extend from the second portion 242*b* of the interfacial layer 242 to the source/drain epitaxial structure 210.

Reference is made to FIGS. 18A-18D. The sacrificial material 128 are removed through the porous portion 242*b* of the interfacial layer 242 to form an inner spacer 128' with an air gap that comes into contact with the porous portion 242*b* of the interfacial layer 242. In some embodiments, the porous portion 242*b* of the interfacial layer 242 may be removed in subsequent processing steps, such that the gate dielectric layer 162 comes in direct contact with the air gap inner spacers 128'. In other words, the gate dielectric layer 162 can be exposed in the air gap inner spacers 128'. Since air has a dielectric constant close to 1, it results in a reduction in capacitance. Specifically, by integrating this air gap in the inner spacer 128', there's a reduction in the capacitance between the gate structure 240 (see FIGS. 19A-19E) and the source/drain epitaxial structure 210, specifically a decrease greater than about 3.5%. The use of air gaps in the inner spacer 128' can lead to improved efficiency and performance of electronic devices by minimizing parasitic capacitance.

Specifically, the porous portion 242*b* of the interfacial layer 242 may include an intricate network of pores (or voids) or channels. These pores serve as gateways that allow for selective penetration of gases or etching agents, granting them access to the materials (e.g., the sacrificial material 128) concealed beneath the porous layer. In some embodiments, a dry etching process, including reactive gases or plasmas as the etching agent, can be employed to remove the sacrificial material 128. The gas or plasma can react with the sacrificial material 128 to produce volatile compounds that are subsequently pumped away. In some embodiments, the etching agent can include hydrochloric acid (HCl) employed in a gaseous form in the dry etching process.

Given the porous nature of the second portion 242*b* of the interfacial layer 242, it serves as a permeable mask, allowing the hydrochloric acid gas to infiltrate the pores and interact directly with the underlying sacrificial material 128. When the sacrificial material 128 comprises silicon germanium (SiGe), its exposure to hydrochloric acid results in a chemical reaction. The silicon component in silicon germanium can react with hydrochloric acid to produce volatile silicon tetrachloride ($SiCl_4$), while the germanium component in silicon germanium can react with hydrochloric acid to produce germanium tetrachloride ($GeCl_4$). Owing the volatile character of the produced silicon tetrachloride and the produced germanium tetrachloride, these by-products can be evacuated or pumped out from the reaction chamber, such that an air gap inner spacer 128' can be formed to inherit the location and the shape of the sacrificial material 128. Therefore, using the porous second portion 242*b* of the interfacial layer 242 as a gateway to selectively etch the sacrificial material 128, it can ensure that only desired regions are etched, preserving the integrity of the neighboring structures.

The air gap inner spacers 128' interleave with the semiconductor layers 124, and space the porous second portion 242*b* of the interfacial layer 242 from the source/drain epitaxial structures 210. Portions of an inner surface of the semiconductor material layer 129 can be exposed in the air gap inner spacers 128'. The spacer layers 127 covers three surfaces of the air gap inner spacers 128', respectively. In some embodiments, the gate spacers 172 may overlap with the air gap inner spacers 128'. By way of example and not limitation, the air gap inner spacer 128' may have a lateral dimension D4 (or width) in a range from about 2 to 10 nm, such as about 2, 3, 4, 5, 6, 7, 8, 9, or 10 nm. By way of example and not limitation, the air gap inner spacer 128' may have a vertical dimension D5 (or height) in a range from about 1 to 10 nm, such as about 1, 2, 3, 4, 5, 6, 7, 8, 9, or 10 nm. In some embodiments, the vertical dimension D5 of the air gap inner spacer 128' can be greater than the thickness D1 of the spacer layer 127. In some embodiments, the vertical dimension D5 of the air gap inner spacer 128' can be greater than the thickness D3 of the interfacial layer 242.

Reference is made to FIGS. 19A-19C and 19E. A gate dielectric layer 244 is formed in the gate trenches GT1 and the openings O1. In addition, the gate dielectric layer 244 is formed over the interfacial layer 242 and around the semiconductor layers 124. The gate dielectric layer 244 may include dielectric materials having a high dielectric constant, for example, greater than that of thermal silicon oxide (~3.9). For example, the gate dielectric layer 244 may include hafnium oxide ($HfO_2$). Alternatively, the gate dielectric layer 244 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

Subsequently, a work function metal layer 246 is formed around the gate dielectric layer 244 and fills the gate trenches GT1 and the openings O1. In some embodiments, the work function metal layer 246 may include a single layer or multi layers. In some embodiments, the work function metal layer 246 can be a P-type work function metal layer or an N-type work function metal layer. By way of example and not limitation, the work function metal layer 246 may include Ti, TiAl, TiAlN, TaC, TaCN, TaSiN, Mn, Zr, TiN, TaN, Ru, Mo, WN, Co, Al, or any suitable materials. The work function metal layer 246 may be formed by ALD, PVD, CVD, or other suitable process. Therefore, gate structures 240 are formed. Each of the gate structures 240 may include interfacial layer 242, the high-k gate dielectric layer 244, and the work function metal layer 246. The gate structure 240 can be interchangeably referred to as a gate strip, a gate pattern, a gate layer, a metal gate, or a gate. Transistors (or nanostructure devices) Tr are formed. The transistors Tr can be N-type transistors and/or P-type transistors. The transistor Tr can include the semiconductor layers 124 as channel regions, the gate structures 240 around the semiconductor layers 124, and a pair of the source/drain epitaxial structures 210 on opposite sides of each of the semiconductor layers 124. The air gap inner spacers 128' are laterally between the gate structure 240 and the source/drain epitaxial structure 210. On the other hand, the porous second portion 242*b* of the interfacial layer 242 is laterally between the gate structure 240 and the source/drain epitaxial structure 210.

Reference is made to FIG. 19D. FIG. 19D is a cross-sectional view of a semiconductor structure 100*a* corresponding FIG. 19C according to some embodiments of the present disclosure. While FIG. 19D show an embodiment of the semiconductor structure 100*a* with different channel cross-sectional view profile than the semiconductor structure 100 in FIGS. 1A-19C and 19E. In addition, the present disclosure may repeat reference numerals and/or letters in the various examples. This repetition is for the purpose of simplicity and clarity and does not in itself dictate a relationship between the various embodiments and/or configurations discussed. As shown in FIG. 19D, the difference between the embodiment in FIG. 19D and the embodiment in FIGS. 1A-19C and 19E is in that a helmet structure 126 is formed atop the gate structure 240. In some embodiments, the helmet structure 126 can be made of dielectric material, such be silicon nitride (SiN), silicon carbonoxide (SiCO), silicon carbonitride (SiCN), silicon oxycarbonitride (SiOCN), or the like. In some embodiments, the helmet structure 126 may have a vertical dimension D6 (or thickness) in a range from about 3 to 15 nm, such as about 3, 4, 5, 6, 7, 8, 9, 10, 11, 12, 13, 14, or 15 nm.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides an inner spacer with an air gap that is adjacent to the high-k gate dielectric layer. Since air has a dielectric constant close to 1, it results in a reduction in capacitance. Specifically, by integrating this air gap, there's a reduction in the capacitance between the metal gate and the source/drain region, specifically a decrease greater than about 3.5%. The use of air gaps in this manner can lead to improved efficiency and performance of electronic devices by minimizing parasitic capacitance.

In some embodiments, a method includes forming semiconductive sheets over a substrate and arranged in a vertical direction; forming source/drain regions on either side of each of the semiconductive sheets; forming first air gap inner spacers interleaving with the semiconductive sheets; forming a gate around each of the semiconductive sheets, wherein the first air gap inner spacers are laterally between the gate and a first one of the source/drain regions. In some embodiments, forming the first air gap inner spacers includes: before forming the source/drain regions, forming silicon germanium materials interleaving with the semiconductive sheets; after forming the source/drain regions, forming an interfacial layer around each of the semiconductive sheets and over inner sidewalls of the silicon germanium materials; removing the silicon germanium materials through the interfacial layer. In some embodiments, the interfacial layer is more porous on the silicon germanium materials than on the semiconductive sheets. In some embodiments, removing the silicon germanium materials is performed by using an etching agent passing through pores on the interfacial layer to etch the silicon germanium materials. In some embodiments, the silicon germanium materials have a germanium atomic concentration greater than about 30%. In some embodiments, forming the interfacial layer is performed with a chemical oxidation process. In some embodiments, the interfacial layer comprises silicon oxide. In some embodiments, the method further includes: forming second air gap inner spacers interleaving with the semiconductive sheets, wherein after forming the gate, the second air gap inner spacers are laterally between the gate and a second one of the source/drain regions. In some embodiments, the method further includes: forming spacer layers enclosing the first air gap inner spacers, wherein the spacer layers interleaving with the semiconductive sheets, and have ring-shaped profiles when viewed in a cross section taken along a lengthwise direction of the gate. In some embodiments, the method further includes: before forming the source/drain regions, forming a source/drain liner on the either side of each of the semiconductive sheets, wherein after forming the first air gap inner spacers, portions of an inner surface of the source/drain liner are exposed in the first air gap inner spacers.

In some embodiments, a method includes forming a stack over a substrate, the stack including first and second channel layers and a disposable dielectric layer interposed between the first and second channel layers; laterally recessing the disposable dielectric layer, such that each of the first and second channel layers laterally extends past opposite end surfaces of the disposable dielectric layer to form recesses therebetween; forming sacrificial materials in the recesses; forming source/drain patterns on either side of each of the first and second channel layers; removing a remainder of the disposable dielectric layer to expose inner surfaces of the sacrificial materials; forming porous dielectric layers over the inner surfaces of the sacrificial materials; removing the sacrificial materials through pores in the porous dielectric layers; forming a gate pattern around the first and second channel layers and laterally between the porous dielectric layers. In some embodiments, removing the sacrificial materials is to form air gaps, such that after the forming the gate pattern, the air gaps are between the gate pattern and the source/drain patterns. In some embodiments, the sacrificial materials are made of a germanium containing material. In some embodiments, the method further includes: forming a porous-free dielectric layer around the first and second channel layers and laterally between the porous dielectric layers. In some embodiments, the step of forming the porous dielectric layers and the step of forming the porous-free dielectric layer are performed simultaneously.

In some embodiments, the semiconductor structure includes a substrate, nanostructures, epitaxial structures, a gate structure, a dielectric spacer, and first air gap inner spacers. The nanostructures are over the substrate and arranged in a vertical direction. The epitaxial structures are on either side of each of the nanostructures. The gate structure is around the nanostructures and between the epitaxial structures. The dielectric spacer is over the nanostructures and on a sidewall of the gate structure. The first air gap inner spacers interleave with the nanostructures and are between the gate structure and a first one of the epitaxial structures. In some embodiments, the semiconductor structure further includes second air gap inner spacers interleaving with the nanostructures and between the gate structure and a second one of the epitaxial structures. In some embodiments, the semiconductor structure further includes a porous dielectric layer between the gate structure and the first one of the epitaxial structures, wherein one of the first air gap inner spacers spaces the porous dielectric layer from the first one of the epitaxial structures. In some embodiments, the porous dielectric layer is in contact with the gate structure. In some embodiments, the semiconductor structure further includes a spacer layer extending from the porous dielectric layer to the first one of the epitaxial structures, wherein the spacer layer has ring-shaped profile when viewed in a cross section taken along a lengthwise direction of the gate structure, and the spacer layer covers three surfaces of the one of the first air gap inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming semiconductive sheets over a substrate and arranged in a vertical direction;

forming a source/drain liner on the either side of each of the semiconductive sheets;

after forming the source/drain liner, forming source/drain regions on either side of each of the semiconductive sheets;

forming first air gap inner spacers interleaving with the semiconductive sheets, wherein portions of an inner surface of the source/drain liner are exposed in the first air gap inner spacers; and forming a gate around each of the semiconductive sheets, wherein the first air gap inner spacers are laterally between the gate and a first one of the source/drain regions.

2. The method of claim 1, wherein forming the first air gap inner spacers comprises:

before forming the source/drain regions, forming silicon germanium materials interleaving with the semiconductive sheets;

after forming the source/drain regions, forming an interfacial layer around exposed portions of the semiconductive sheets and over inner sidewalls of the silicon germanium materials; and removing the silicon germanium materials through the interfacial layer.

3. The method of claim 2, wherein the interfacial layer is more porous on the silicon germanium materials than on the semiconductive sheets.

4. The method of claim 3, wherein removing the silicon germanium materials is performed by using an etching agent passing through pores on the interfacial layer to etch the silicon germanium materials.

5. The method of claim 2, wherein the silicon germanium materials have a germanium atomic concentration greater than about 30%.

6. The method of claim 2, wherein forming the interfacial layer is performed with a chemical oxidation process.

7. The method of claim 2, wherein the interfacial layer comprises silicon oxide.

8. The method of claim 1, further comprising:

forming second air gap inner spacers interleaving with the semiconductive sheets, wherein after forming the gate, the second air gap inner spacers are laterally between the gate and a second one of the source/drain regions.

9. The method of claim 1, further comprising:

forming spacer layers, wherein the spacer layers interleaving with the semiconductive sheets, and have ring-shaped profiles when viewed in a cross section taken along a lengthwise direction of the gate.

10. The method of claim 1, wherein the source/drain liner comprises boron-doped silicon.

11. A method, comprising:

forming a stack over a substrate, the stack including first and second channel layers and a disposable dielectric layer interposed between the first and second channel layers;

laterally recessing the disposable dielectric layer, such that each of the first and second channel layers laterally extends past opposite end surfaces of the disposable dielectric layer to form recesses therebetween;

forming sacrificial materials in the recesses;

forming source/drain patterns on either side of each of the first and second channel layers;

removing a remainder of the disposable dielectric layer to expose inner surfaces of the sacrificial materials;

forming porous dielectric layers over the inner surfaces of the sacrificial materials;

removing the sacrificial materials through pores in the porous dielectric layers; and forming a gate pattern around the first and second channel layers and laterally between the porous dielectric layers.

12. The method of claim 11, wherein removing the sacrificial materials is to form air gaps, such that after the forming the gate pattern, the air gaps are between the gate pattern and the source/drain patterns.

13. The method of claim 11, wherein the sacrificial materials are made of a germanium containing material.

14. The method of claim 11, further comprising:

forming a porous-free dielectric layer around exposed portions of the first and second channel layers and vertically between the porous dielectric layers.

15. The method of claim 14, wherein the step of forming the porous dielectric layers and the step of forming the porous-free dielectric layer are performed simultaneously.

16. A method, comprising:

forming a stack over a substrate, the stack comprising a first nanostructure, a second nanostructure vertically spaced from the first nanostructure, and a first sacrificial material disposed between the first and second nanostructures;

laterally recessing the first sacrificial material relative to sidewalls of the first and second nanostructures to form a recess;

forming a spacer layer in the recess, the spacer layer comprising a vertical portion lining a recessed sidewall of the first sacrificial material, and opposing horizontal portions extending from the vertical portion to line inner surfaces of the first and second nanostructures in a cross-sectional view;

forming a second sacrificial material in the recess, such that the second sacrificial material is almost enclosed by the spacer layer;

forming epitaxial structures on opposite sides of the stack;

removing the first sacrificial material to expose the vertical portion of the spacer layer;

selectively removing the vertical portion of the spacer layer to expose the second sacrificial material;

forming an interfacial layer over an inner surface of the second sacrificial material, wherein the interfacial layer is porous;

removing the second sacrificial material through the interfacial layer to form an air gap inner spacer; and forming a gate structure surrounding the first and second nanostructures.

17. The method of claim 16, wherein the second sacrificial material comprises a germanium-containing material.

18. The method of claim 17, wherein the germanium-containing material has a germanium atomic concentration greater than about 30 percent.

19. The method of claim 16, wherein forming the interfacial layer comprises performing a chemical oxidation process to form an oxide layer over the second sacrificial material.

20. The method of claim 16, wherein removing the second sacrificial material comprises introducing a halogen-containing etchant through pores of the interfacial layer to selectively react with the second sacrificial material.

* * * * *